(12) United States Patent
Sankrithi

(10) Patent No.: US 7,997,264 B2
(45) Date of Patent: Aug. 16, 2011

(54) INFLATABLE HELIOSTATIC SOLAR POWER COLLECTOR

(75) Inventor: Mithra M. K. V. Sankrithi, Lake Forest Park, WA (US)

(73) Assignee: RIC Enterprises, Mountlake Terrace, WA (US)

( * ) Notice: Subject to any disclaimer, the term of this patent is extended or adjusted under 35 U.S.C. 154(b) by 1232 days.

(21) Appl. No.: 11/651,396

(22) Filed: Jan. 10, 2007

(65) Prior Publication Data
US 2010/0229850 A1  Sep. 16, 2010

(51) Int. Cl.
*F24J 2/12* (2006.01)
(52) U.S. Cl. ......... 126/697; 126/571; 126/600; 126/692
(58) Field of Classification Search .................. 126/571, 126/600, 692, 697
See application file for complete search history.

(56) References Cited

U.S. PATENT DOCUMENTS

| | | | | |
|---|---|---|---|---|
| 3,031,928 A | * | 5/1962 | Kopito | 359/847 |
| 3,125,091 A | * | 3/1964 | Sleeper, Jr. | 126/624 |
| 3,565,368 A | * | 2/1971 | Byron et al. | 244/31 |
| 3,908,631 A | * | 9/1975 | Rom | 126/625 |
| 3,972,600 A | * | 8/1976 | Cobarg | 359/840 |
| 3,976,508 A | * | 8/1976 | Mlavsky | 136/246 |
| 4,031,674 A | * | 6/1977 | Rand | 52/2.14 |
| 4,051,834 A | * | 10/1977 | Fletcher et al. | 126/625 |
| 4,088,120 A | * | 5/1978 | Anderson | 126/573 |
| 4,136,673 A | * | 1/1979 | Escher | 126/606 |
| 4,160,443 A | * | 7/1979 | Brindle et al. | 126/625 |
| 4,168,696 A | * | 9/1979 | Kelly | 126/683 |
| 4,171,003 A | * | 10/1979 | Forrat | 136/247 |
| 4,173,213 A | * | 11/1979 | Kelly | 126/604 |
| 4,182,307 A | * | 1/1980 | Brindle et al. | 126/625 |
| 4,203,420 A | * | 5/1980 | Schoenfelder | 126/625 |
| 4,306,540 A | * | 12/1981 | Hutchison | 126/607 |
| 4,317,444 A | * | 3/1982 | Maruko | 126/571 |
| 4,365,616 A | * | 12/1982 | Vandenberg | 126/581 |
| 4,427,838 A | * | 1/1984 | Goldman | 136/248 |
| 4,485,804 A | * | 12/1984 | Sharpe | 126/625 |
| 4,517,957 A | * | 5/1985 | Pelley | 126/625 |
| 4,534,525 A | * | 8/1985 | Bliamptis | 244/30 |
| 5,365,920 A | * | 11/1994 | Lechner | 126/696 |
| 5,404,868 A | * | 4/1995 | Sankrithi | 126/604 |
| 5,893,360 A | * | 4/1999 | Stoumen et al. | 126/714 |
| 6,111,190 A | * | 8/2000 | O'Neill | 136/246 |
| 6,498,290 B1 | * | 12/2002 | Lawheed | 136/246 |
| 6,696,637 B2 | * | 2/2004 | Lawheed | 136/246 |
| 6,897,832 B2 | * | 5/2005 | Essig et al. | 343/912 |

(Continued)

FOREIGN PATENT DOCUMENTS
WO   WO 2005003645 A1 *  1/2005

*Primary Examiner* — Kenneth B Rinehart
*Assistant Examiner* — Jorge Pereiro

(57) ABSTRACT

Increased utilization of solar power is highly desirable as solar power is a readily available renewable resource with power potential far exceeding total global needs; and as solar power does not contribute to pollutants associated with fossil fuel power, such as unburned hydrocarbons, NOx and carbon dioxide. The present invention provides low-cost inflatable heliostatic solar power collectors, which can be stand-alone units suitable for flexible utilization in small, medium, or utility scale applications. The inflatable heliostatic power collectors use a reflective surface or membrane "sandwiched" between two inflated chambers, and attached solar power receivers which may be of photovoltaic and/or solar thermal types. Modest concentration ratios enable benefits in both reduced cost and increased conversion efficiency, relative to simple prior-art flat plate solar collectors.

36 Claims, 31 Drawing Sheets

U.S. PATENT DOCUMENTS

| | | | |
|---|---|---|---|
| 6,994,082 B2* | 2/2006 | Hochberg et al. | 126/696 |
| 7,270,295 B2* | 9/2007 | Bennett | 244/59 |
| 7,382,332 B2* | 6/2008 | Essig et al. | 343/878 |
| 7,562,493 B2* | 7/2009 | Kassianoff | 52/2.25 |
| 7,612,735 B2* | 11/2009 | Essig et al. | 343/915 |
| 7,637,457 B2* | 12/2009 | Bennett | 244/59 |
| 2001/0006066 A1* | 7/2001 | Cherney et al. | 126/698 |
| 2002/0179138 A1* | 12/2002 | Lawheed | 136/246 |
| 2003/0020667 A1* | 1/2003 | Essig, Jr. et al. | 343/832 |
| 2004/0055594 A1* | 3/2004 | Hochberg et al. | 126/696 |
| 2004/0207566 A1* | 10/2004 | Essig et al. | 343/878 |
| 2004/0216734 A1* | 11/2004 | Lawheed | 126/573 |
| 2005/0103329 A1* | 5/2005 | Essig et al. | 126/697 |
| 2006/0033674 A1* | 2/2006 | Essig et al. | 343/912 |
| 2006/0059788 A1* | 3/2006 | Kassianoff | 52/2.11 |
| 2006/0091076 A1* | 5/2006 | Marcellus | 210/640 |
| 2006/0144393 A1* | 7/2006 | Le Lievre | 126/684 |
| 2006/0157050 A1* | 7/2006 | Le Lievre | 126/696 |
| 2008/0047546 A1* | 2/2008 | Cummings | 126/684 |
| 2008/0121755 A1* | 5/2008 | Bennett | 244/59 |
| 2009/0260620 A1* | 10/2009 | Winger et al. | 126/600 |
| 2010/0101559 A1* | 4/2010 | Grant et al. | 126/600 |
| 2010/0108057 A1* | 5/2010 | Cummings et al. | 126/697 |
| 2010/0162702 A1* | 7/2010 | Bennett | 60/659 |
| 2010/0186733 A1* | 7/2010 | Hoefler | 126/625 |

* cited by examiner

INFLATABLE HELIOSTATIC SOLAR POWER COLLECTOR

BACKGROUND OF THE INVENTION

Increased utilization of solar power is highly desirable as solar power is a readily available renewable resource with power potential far exceeding total global needs; and as solar power does not contribute to pollutants associated with fossil fuel power, such as unburned hydrocarbons, NOx and carbon dioxide. Solar powerplants produce no carbon dioxide that contributes as a greenhouse gas to global warming—in sharp contrast to fossil fuel powerplants such as coal, oil, natural gas, or even biofuel powerplants. Limitations to the widespread deployment of solar power, either solar photovoltaic power or solar thermal power, have largely been a consequence of higher power cost per kilowatt-hour for traditional solar power systems as compared with fossil fuel power systems, driven in large part by the cost to make these solar power systems.

As an enabler for low cost solar power, the idea of using inflatable heliostats (devices that track the Sun's apparent motion), was first proposed in the pioneering U.S. Pat. No. 5,404,868 entitled "Apparatus Using a Balloon Supported Reflective Surface for Reflecting Light from the Sun."

BRIEF SUMMARY OF THE INVENTION

The present invention provides further inventive development of inflatable heliostat devices, with added novelty in multiple areas. More specifically, the present invention provides for low-cost inflatable heliostatic solar power collectors, which are stand-alone units suitable for use in small, medium, or utility scale applications, as opposed to prior art "power tower" concepts best suited for utility scale application. In one preferred embodiment the inflatable heliostatic power collector uses a reflective surface or membrane "sandwiched" between two inflated chambers, and an elongated solar power receiver which receives solar insolation reflected and concentrated by this reflective surface.

The power receiver may be of photovoltaic and/or solar thermal types, in variant preferred embodiments of the invention. The utilization of modest concentration ratios enables benefits in both reduced cost and increased conversion efficiency, relative to simple prior-art flat plate solar collectors.

In a preferred embodiment the inflatable structure includes inventive application of simple lightweight and low cost frame members, and heliostatic aiming for azimuth and elevation control using simple and low cost motorized control means. The invention provides great flexibility and value in tailored applications using varying numbers of the low-cost inflatable heliostatic power collectors, of varying scalable size designs, for optimal use in applications ranging from (i) one or a few units for private home installations on a rooftop or back-yard, to (ii) estate/farm/ranch/commercial building installations with a small/medium field of units, to (iii) utility scale installations with medium/large/very large field(s) of units.

DETAILED DESCRIPTION

Figure 1A:
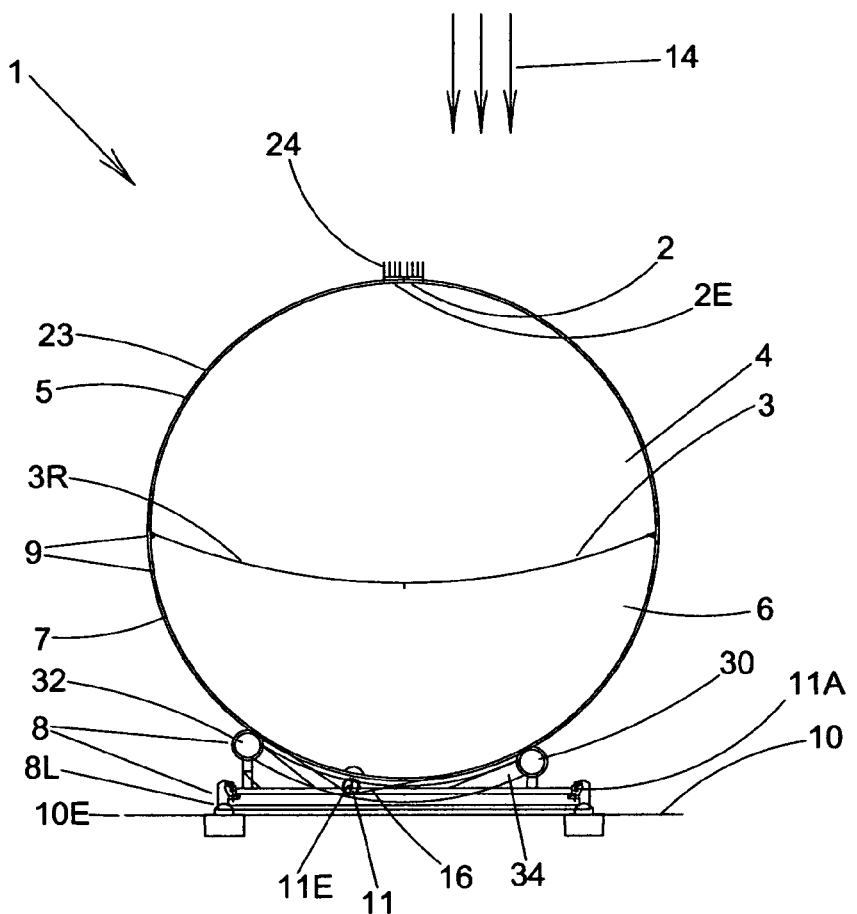
FIG. 1A shows a left end view of a preferred embodiment of the invention.

FIG. 1A shows a left end view of a preferred embodiment of the invention, an inflatable heliostatic solar power collector 1 that applies an ingenius lightweight inflatable structural design to enable concentrating solar powerplants with elongated solar receivers that can be made at unprecedented low cost—for small, medium and large-scale applications for electricity and/or heat generation from clean, renewable and plentiful solar power coming from the Sun.

An inflatable heliostatic solar power collector 1 is shown, comprising: a reflection and concentrating surface 3 for reflecting and concentrating sunrays; a substantially enclosed upper inflatable volume 4 above said reflection and concentrating surface 3, with a transparent surface 5 above said upper inflatable volume; a substantially enclosed lower inflatable volume 6 below said reflection and concentrating surface 3, with a bottom surface 7 below said lower inflated volume; support structure 8 for supporting said solar power collector on a supporting surface 10; and heliostatic control means 11 for aiming said solar power collector as a function of at least one of time and other parameters, such that incoming sunrays 14 from a sunward direction will be reflected and concentrated by said reflection and concentration surface, onto a structurally connected solar power receiver 2 proximate to said transparent surface 5, at a concentration ratio of at least 2 suns.

The embodiment of FIG. 1A can also be described as an inflatable heliostatic solar power collector 1, comprising: an elongated solar power receiver 2E (elongation axis into the page in this end view); a reflection and concentrating surface 3 for reflecting and concentrating sunrays; a substantially enclosed elongated upper inflatable volume 4 above said reflection and concentrating surface 3, with a transparent surface 5 above said upper inflatable volume; a substantially enclosed elongated lower inflatable volume 6 below said reflection and concentrating surface 3, with a bottom surface 7 below said lower inflated volume; support structure 8 for supporting said solar power collector on a supporting surface 10; and heliostatic control means 11 for aiming said solar power collector as a function of at least one of time and other parameters, such that incoming sunrays 14 from a sunward direction will be reflected and concentrated by said reflection and concentration surface, onto said elongated solar power receiver 2E at a concentration ratio of at least 2 suns.

With the elongated solar power receiver 2E receiving concentrated solar radiation, an optional set of cooling fins 24 may be provided immediately adjacent to and above the solar power receiver, to prevent any undesirable overheating of the solar power receiver with potential adverse effects on material properties and/or solar receiver efficiency.

In FIG. 1A the illustrated support structure 8 includes permanently connected elongated framing members 9 forming a framework around the upper inflatable volume 4 and lower inflatable volume 6, as well as 2 support legs 8L visibly illustrated in this view, out of multiple support legs numbering from 3 to 12 in typical embodiments. FIG. 1A also shows that support structure 8 further includes a front support bar 30, a rear support bar 32, and a curved connecting bar 34 connecting the ends of the front support bar 30 and the rear support bar 32; and also further includes a cross-section perimeter enclosing structural ring 23 which can contribute to restraining the transparent surface 5 and the bottom surface 7 against inflation-induced forces arising from inflation of the upper part and the lower part of the inflatable volume (i.e., the upper inflatable volume 4 and lower inflatable volume 6 in the illustrated embodiment). In the illustrated embodiment the supporting surface 10 is an Earth surface 10E. While a level Earth or ground surface is shown, in alternate embodiments the invention can be installed on a sloped surface, and surface treatments such as local paving with asphalt or a concrete pad could be optionally used.

FIG. 1A further illustrates the inflatable heliostatic solar power collector 1, wherein the support structure 8 includes means for fixedly engaging the supporting surface 10 and further includes bearing-connected means for supporting the combination of the bottom surface 7, the reflection and concentrating surface 3, the transparent surface 5 and the solar power receiver 2, so as to permit motion of said combination as commanded and controlled by heliostatic control means; wherein the heliostatic control means here includes (i) powered elevation control means 11E for orienting said combination in elevation angle, and (ii) powered azimuth control means 11A for orienting said combination in azimuth angle.

The transparent surface 5 could be a flexible transparent sheet made of representative materials such as transparent polycarbonate film or transparent vinyl or polyethylene film. Desired attributes of the transparent sheet include high transparency, tensile strength, low cost, weather resistance, resistance to discoloration from sunlight exposure, temperature resistance, durability, scratch & impact & tear & puncture resistance against wind-blown sand, heavy rain, sleet or hail. In variant embodiments part or all of the transparent surface could also optionally use semirigid or rigid transparent materials such as glass, tempered glass, acrylic or plexiglass, or semirigid or rigid polycarbonate. The bottom surface 7 could be made of nontransparent or not necessarily transparent sheet material such as "plastic" sheet (e.g., polyester, polycarbonate, polyvinyl, etc.) or artificial or natural fabric material treated to be substantially airtight. Desired attributes of the bottom surface include durability, impact & tear & puncture resistance, ability to maintain an approximate desired shape, and very low cost.

FIG. 1A further illustrates the inflatable heliostatic solar power collector 1, wherein said reflection and concentrating surface 3 includes a reflective membrane 3R which is reflective on its upper side (e.g., a reflectorized polyester/mylar membrane as an example); and wherein an upwardly concave desired shape of said reflection and concentrating surface 3 is at least in part maintained by the application of differential inflation pressure between said upper inflatable volume 4 and said lower inflatable volume 6, with an appropriate positive differential pressure contributing to imparting the upwardly concave desired shape. Note that the pressure-induced shape is approximately a circular arc shape, which in turn is an approximation of a perfectly focusing parabolic shape. In variant embodiments substantially rigid shaping elements may be affixed to the lower side of the reflection and concentrating surface, to also contribute to imparting the desired shape, which may be more precisely defined as a near-parabolic shape for embodiments with high concentration ratios of 30 or more. Desired attributes of a reflective membrane include tensile strength, very high reflectivity, smooth surface, ability to maintain the desired shape, temperature resistance, durability, and low cost.

Figure 1B:
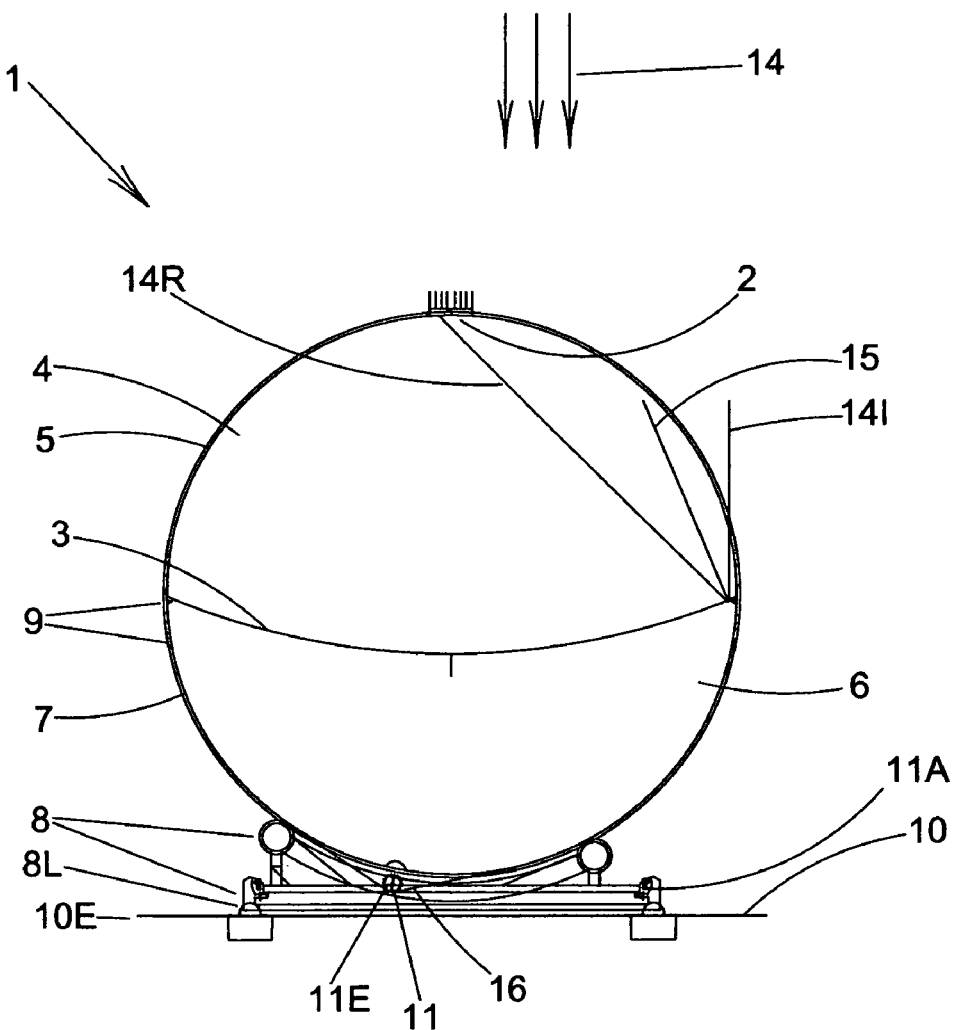
FIG. 1B shows the same view as FIG. 1A, illustrating how a representative incoming sunray is reflected around to the solar power receiver.

FIG. 1B shows the same view as FIG. 1A, now illustrating how a representative incoming sunray 14I is reflected around a local normal vector 15 to the reflection and concentrating surface 3, to proceed as representative reflected sunray 14R to the solar power receiver 2. The upwardly concave desired shape of said reflection and concentrating surface 3 is at least in part maintained by the application of differential inflation pressure between said upper inflatable volume 4 and said lower inflatable volume 6, with an appropriate positive differential pressure contributing to imparting the upwardly concave desired shape. The desired shape will preferably reflect incident sunlight falling on the entire reflection and concentrating surface 3 onto the solar power receiver 2, and preferably also without large local variations in solar energy flux hitting different points on the receiving surface of the solar power receiver.

Figure 1C:
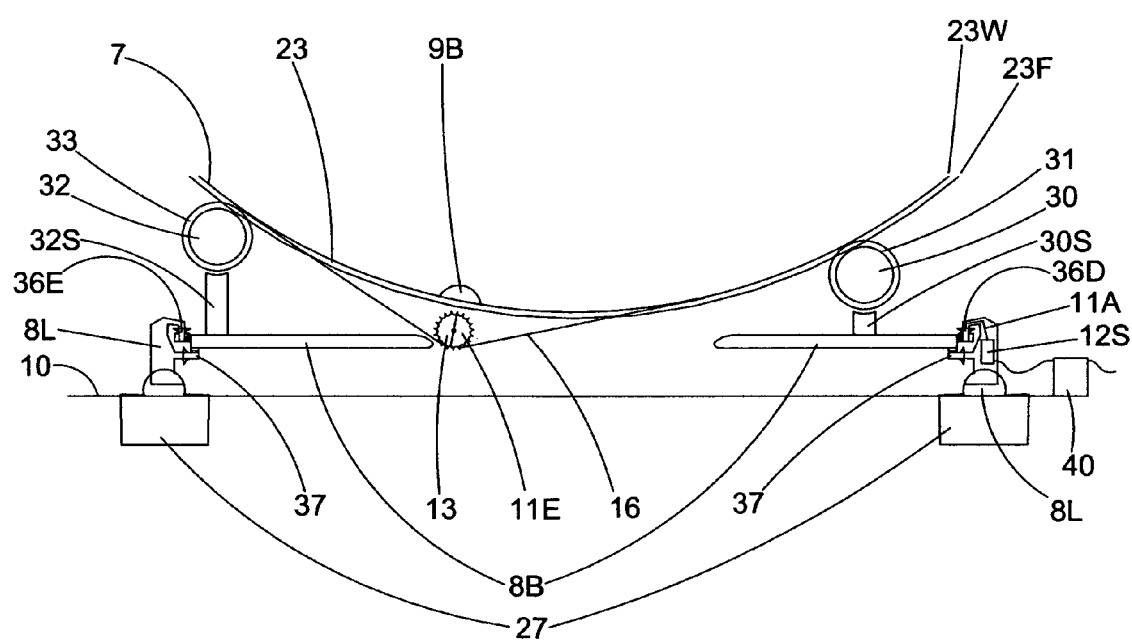
FIG. 1C shows an enlarged sectional view on a vertical plane cut, to illustrate in more detail how the preferred embodiment of FIG. 1A provides heliostatic control.

FIG. 1C shows an enlarged sectional view on a vertical plane cut, to illustrate in more detail how the preferred embodiment of FIG. 1A provides heliostatic control means including (i) powered elevation control means 11E for orienting said combination in elevation angle, and (ii) powered azimuth control means 11A for orienting said combination in azimuth angle. The powered elevation control means 11E comprises a powered sprocket 13 engaging an elevation control transmission element selected from the group 16 consisting of a chain and a cable—here a thin but strong strap with periodic holes that are positively and precisely engaged by the powered sprocket 13. The termini of the strap are secured inside an outwardly facing Channel-section (C-section) structural ring 23, adjacent to the outer face of the inner web 23W of the C-section structural ring and between the two flanges of the C-section. The outward flange edges (with optional lips) 23F of the C-section structural ring are also visible in this view. The powered sprocket 13 precisely executes elevation angle control of the heliostatic solar power collector, including the reflective surface and the solar receiver, by precisely moving the strap, which precisely rotates the structural ring 23, which in turn precisely rotates the combination of the bottom surface 7, the reflection and concentrating surface, the transparent surface and the solar power receiver, so as to permit motion of said combination as commanded and controlled by the heliostatic control means.

The structural ring 23 is located relative to a front support bar 30 by a front support roller 31 which provides bearing-connected means for the front support bar to support and locate the structural ring, with the front support roller 31 just fitting into the C-section between the outward flange edges 23F and with a rolling contact engagement of the outer face of the inner web 23W; and with the rear support roller 33 also just fitting into the C-section between the outward flange edges 23F and with a rolling contact engagement of the outer face of the inner web 23W. In alternate embodiments the rolling locating interface between the support bar and the structural rings can utilize any of a variety of track and wheel/roller or slot and wheel/roller interfaces, with the track or slot on either side of the interface, within the spirit and scope of the invention.

The front support bar 30 is supported on the structural base ring 8B by front support bar supporting member 30S, which is a panel or wall type member as illustrated, and may be of solid, hollow, or sandwich structural type. Similarly the rear support bar 32 is supported on the structural base ring 8B by rear support bar supporting member 32S, which is also a panel or wall type member as illustrated. The entire structural base ring 8B is rotatable in azimuth angle by powered azimuth control means 11A, with the azimuthal rotation being enabled by the use of bearing-connected means for support legs 8L to support the structural base ring 8B.

The powered azimuth control means 11A comprises at least one of (i) a powered sprocket which engages an azimuth control transmission element selected from the group consisting of a chain and a cable, and (ii) a powered gear below said bottom surface 7 which powered gear engages and drives a gear element on an azimuth control element selected from the group of a structural base ring portion of said support structure and a base plate portion (here the structural base ring 8B) of said support structure. In the illustrated preferred embodiment a powered gear is shown, here comprising a conventional gear type of edge drive gear 36D which engages teeth on the outer edge of the structural base ring 8B. Note that other gear types or friction engagement means may be used in alternate embodiments of the invention, and that chain/cable driven azimuth control can be provided in still other embodiments, within the spirit and scope of the invention as described and claimed herein.

The heliostatic control means includes at least one of an electrically powered motor, a linear actuator, and a stepper motor, with a stepper motor 12S here illustrated as driving the edge drive gear 36D to precisely control the azimuth angle of the structural base ring 8B, and thence the azimuth angle of the combination of the bottom surface 7, the reflection and concentrating surface, the transparent surface and the solar power receiver, so as to permit azimuthal motion of said combination as commanded and controlled by the heliostatic control means.

The combination of the azimuth control and the elevation control enable heliostatic pointing of the inflatable solar power collector to always face the Sun, and to maximize power collected at any installation location, time of year and time of day. A heliostatic control module 40 is illustrated, which includes power and computation means such as a microprocessor or computer, to issue azimuth and elevation control commands. The heliostatic control means for aiming said solar power collector as a function of at least one of time and other parameters, preferably performs its aiming function also as a function of at least one of (i) time of day, (ii) time of year, (iii) latitude of the location of installation of said heliostatic solar power collector, (iv) installation orientation of the support structure relative to the supporting surface 10, and (v) slope of the supporting surface. The heliostatic control module 40 may also optionally combine and incorporate power conditioning means for receiving solar power from the solar receiver, conditioning this power as desired (AC vs DC, frequency, phase, voltage and current characteristics, transient smoothing/control, etc), and then transmitting the power to a user, e.g. via an electrical wire or cable.

Figure 1D:
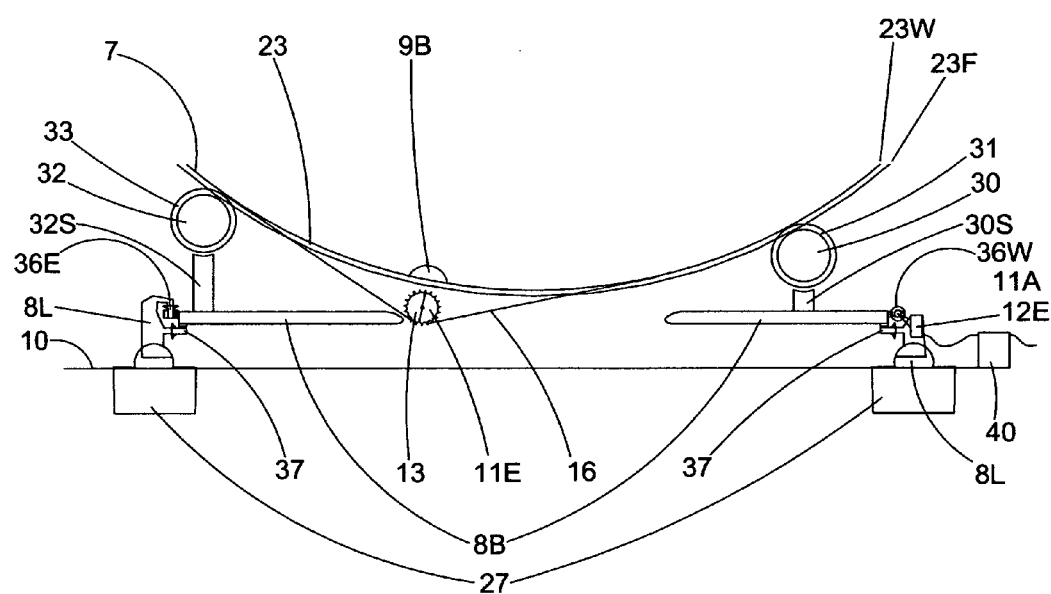
FIG. 1D shows a similar view as FIG. 1C, but with an azimuth drive using an edge drive worm gear.

FIG. 1D shows a similar view as FIG. 1C, but with the azimuth drive now using an edge drive worm gear 36W engaging inclined teeth on the upper outer perimeter of the structural base ring 8B. In this illustrated embodiment the worm gear is driven by an electrically powered motor 12E, rather than a stepper motor. In variant embodiments alternate combinations of motors (and/or linear actuators) and gears can be used within the sprit and scope of the invention as defined and claimed herein.

Figure 2A:
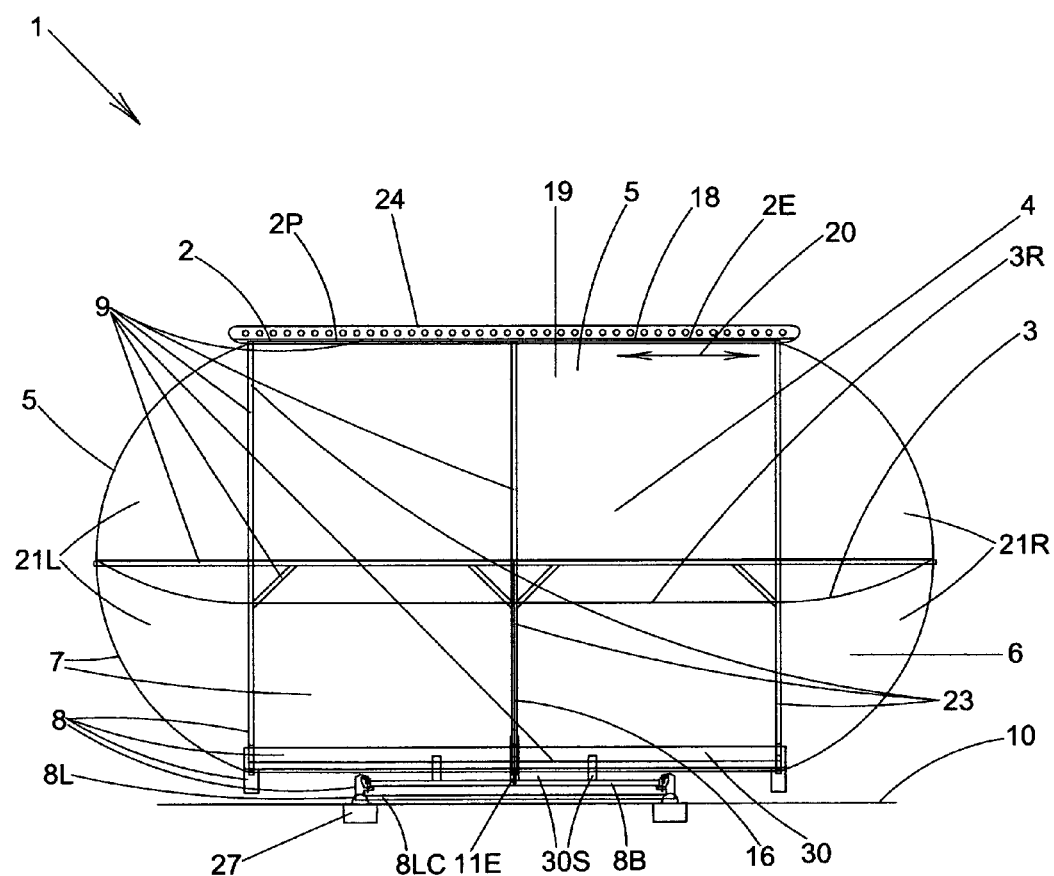
FIG. 2A shows a front view of the preferred embodiment of FIG. 1A and FIG. 1B.

FIG. 2A shows a front view of the preferred embodiment of FIG. 1A and FIG. 1B.

As illustrated, the inflatable heliostatic solar power collector 1 includes a solar power receiver 2 which is a photovoltaic receiver 2P in the configuration of a linear solar power collector 18.

The geometric configuration of the solar power collector 1 is seen to include a central portion 19 with an approximately constant cross-section on planar cuts perpendicular to an axis of elongation 20 of the elongated solar power receiver 2E, and further includes left end closure portion 21L and right end closure portion 21R on the left and right sides of said central portion, which left and right closure portions serve to provide left and right side enclosure for said upper inflatable volume 4 and said lower inflatable volume 6. The left and right closure portions may use enclosing surfaces which are flexible membranes, semirigid surfaces such as flexible membranes with rigidifying and/or shaping attached members, and/or rigid enclosing surface members. When flexible members are used, they may be either unshaped flexible members which assume a desired shape under inflation pressure, or shaped or tailored flexible members that have a nominal shape that is maintained or reinforced when subject to inflation pressure. An example of prior art use of flat flexible members that take a desired shape under inflation pressure is the use of two flat sheets seamed together at their edges in mylar balloons, which when inflated take an oval or near-ellipsoidal shape, with membrane crinkling at the equatorial seams of the balloon.

FIG. 2A also clearly shows that support structure 8 including permanently connected elongated framing members 9 forming a framework around the upper inflatable volume 4 and lower inflatable volume 6, further comprises a plurality of cross-section perimeter enclosing structural rings 23 which can contribute to restraining the transparent surface 5 and the bottom surface 7 against inflation-induced forces arising from inflation of the upper part and the lower part of the inflatable volume (i.e., the upper inflatable volume 4 and lower inflatable volume 6 in the illustrated embodiment).

Connecting interfaces between various combinations of the reflection and concentrating surface 3, the transparent surface 5, the bottom surface 7, the framing members 9 and the structural rings 23, can be of a variety of many known interface types including mechanical interfaces (e.g., tongue & groove joints, zip-lock type joints etc), fastener connected interfaces (e.g., using bolts, nuts, screws, rivets, zippers etc), heat-welded or laser-welded seams, bonded joints with lap or butt joint interfaces, sealing taped joints, and combination or hybrid joints and interfaces as known from the prior art. A required condition of whatever is the selected interface and joint solution is that the upper inflatable volume 4 and the lower inflatable volume 6 must be fully enclosed and sealed to prevent air leakage from these inflated volumes to the atmosphere outside the inflatable heliostatic solar power collector 1, using some combination of the surfaces, framing members and structural rings as recited above, along with appropriately sealed interfaces or joints. Selection of specific joint architectures should preferably take into consideration low cost and weight, minimizing leaks, and ease of repair or replacement of surfaces or portions of surfaces in case of damage (scratching etc) or rupture. One option would be to use sealed seams at a perimeter interface line connecting the transparent surface 5, reflection and concentration surface 3, and bottom surface 7, to fully enclose the upper inflatable volume 4 and the lower inflatable volume 6, while connecting outside the inflatables to the framing members. Another option would be to use panels of surface members such as membranes, which connect to adjacent framing members around each panel's perimeter and are sealed at those interfaces (e.g., using a bonded lap joint, a heat-seamed lap joint, or a zipper or zip-locked joint with a covering adhesive sealing tape which is transparent for transparent surface sealing). The use of multiple panels increases the risk of leaks, but eases the ability to replace a single damaged panel if such localized damage should occur.

Figure 2B:
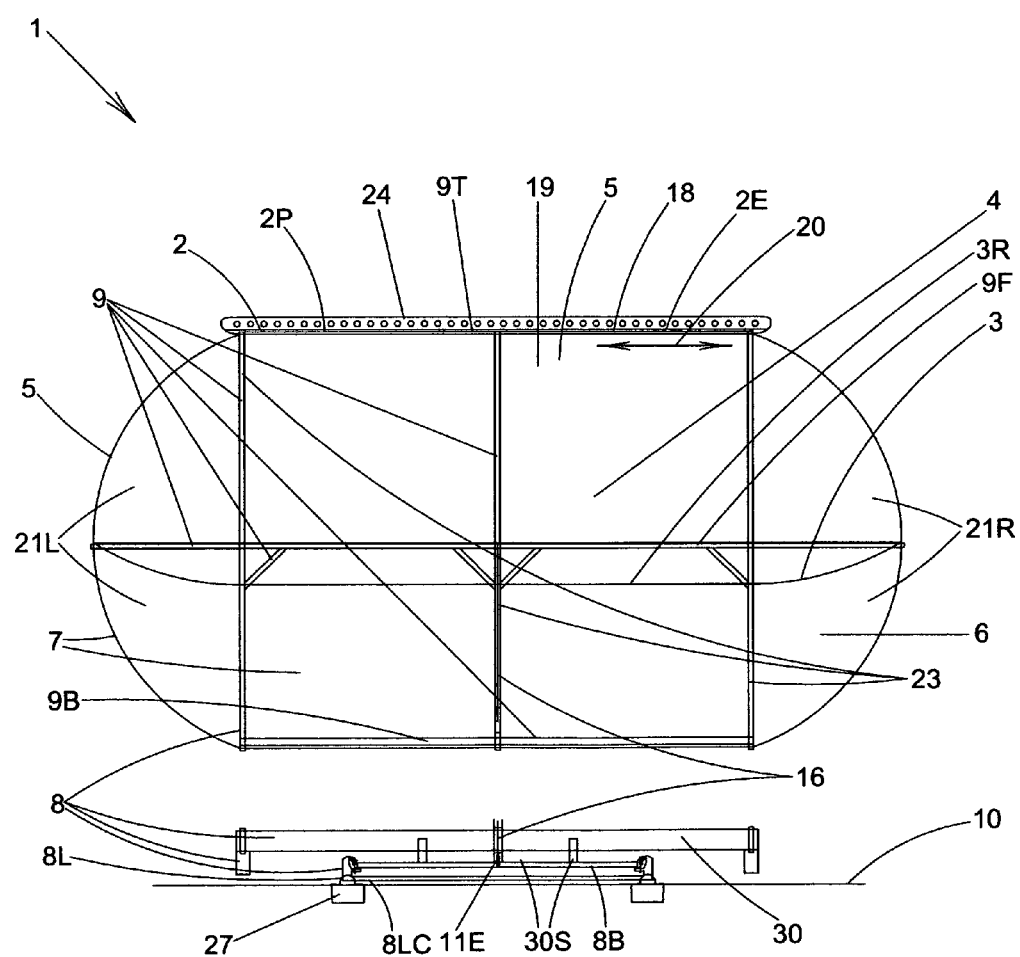
FIG. 2B shows the same view as FIG. 2A, but with the upper and lower parts of the inflatable heliostatic solar power collector 1 separated to more clearly show the component elements.

FIG. 2B shows the same view as FIG. 2A, but with the upper and lower parts of the inflatable heliostatic solar power collector 1 separated to more clearly show the component elements. The framing members 9 are more clearly distinguishable, with a top frame member 9T above the upper inflated volume 4 and adjacent to and contributing to the support of the elongated solar receiver 2E; a front frame member 9F substantially at the intersection of the front bottom edge of the transparent surface 5, the front edge of the reflection and concentrating surface 3, and the front top edge of the bottom surface 7; and a bottom frame member 9B near (but in this example not located exactly at) the bottom of the bottom surface 7. Again, the bottom frame member 9B may also optionally include some ballast weight to help locate the center of mass of the rotating-in-elevation parts of the device as elevation angle pointing control is executed by the heliostatic control means 11.

Figure 3A:
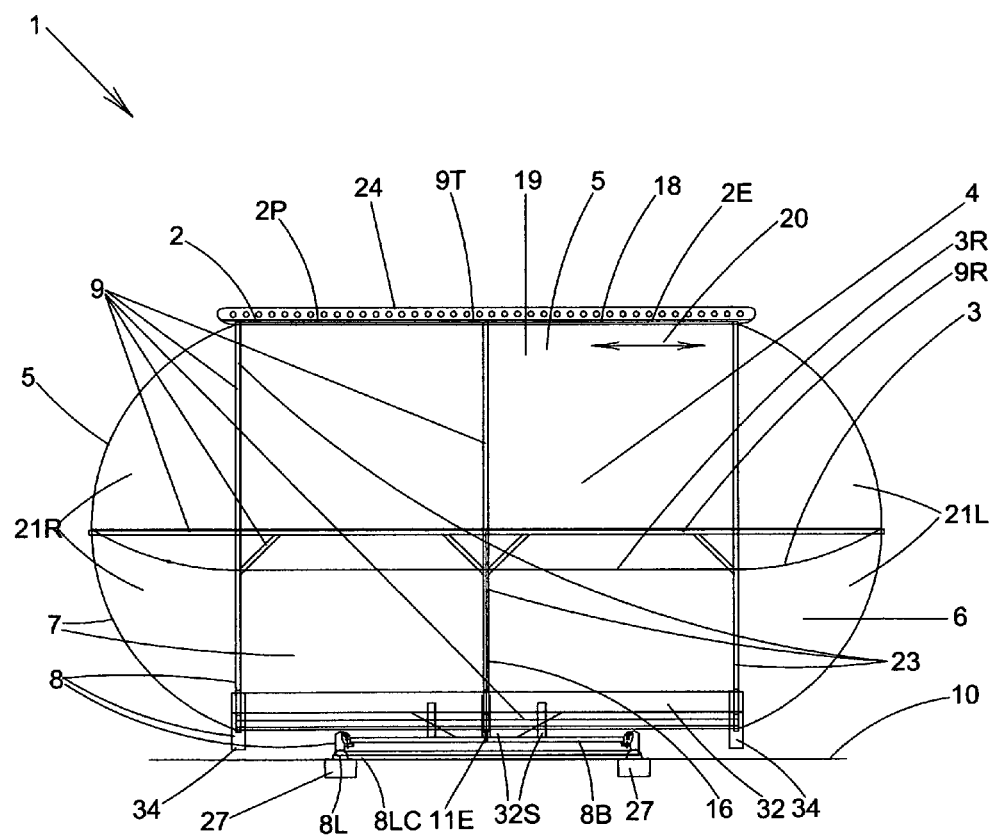
FIG. 3A shows a rear view of the preferred embodiment of FIGS. 1A and 2A.

FIG. 3A shows a rear view of the preferred embodiment of FIGS. 1A and 2A.

FIG. 3A shows an inflatable heliostatic solar power collector 1, comprising: a reflection and concentrating surface 3 for reflecting and concentrating sunrays; a substantially enclosed upper inflatable volume 4 above said reflection and concentrating surface 3, with a transparent surface above 5 said upper inflatable volume 4; a substantially enclosed lower inflatable volume 6 below said reflection and concentrating surface 3, with a bottom surface 7 below said lower inflated volume 6; support structure 8 for supporting said solar power collector on a supporting surface 10; and heliostatic control means 11 for aiming said solar power collector as a function of at least one of time and other parameters, such that incoming sunrays from a sunward direction (down from the top of the page in the illustrated view) will be reflected and concentrated by said reflection and concentration surface 3, onto a structurally connected solar power receiver 2 proximate to said transparent surface 5, at a concentration ratio of at least 2 suns;

wherein said solar power receiver 2 further comprises means for generating useful electrical power from received solar power (here comprising the solar cell elements included in photovoltaic receiver 2P); wherein said solar power receiver 2 is an elongated solar power receiver 2E that has greater length along an axis of elongation 20 than along any other axis; wherein said reflection and concentrating surface 3 has greater length along said axis of elongation 20 than along any other axis; wherein said transparent surface 5, said bottom surface 7, and said reflection and concentrating surface 3 each include flexible membrane elements whose shapes are dependant on inflation of said upper inflatable volume 4 and said lower inflatable volume 6; wherein an upwardly concave desired shape of said reflection and concentrating surface 3 is at least in part maintained by the application of differential inflation pressure between said upper inflatable volume 4 and said lower inflatable volume 6; further comprising an enclosing structural ring 23 on a plane substantially perpendicular to said axis of elongation 20, which enclosing structural ring 23 can contribute to restraining said transparent surface 5 and said bottom surface 7 against inflation-induced forces arising from inflation of the upper part and the lower part of the inflatable volume (i.e., the upper inflatable volume 4 and lower inflatable volume 6 respectively); further comprising an elongated structural member (here the top frame member 9T) that has greater length along an axis of elongation than along any other axis, which elongated structural member provides structural support to maintain said elongated solar power receiver 2E in its desired location and orientation to receive sunrays reflected and concentrated by said reflection and concentrating surface 3; further comprising elongated side perimeter structural members (i.e., rear frame member 9R visible in this view, and front frame member 9F visible in the view shown in FIG. 2B) that have greater length along said axis of elongation than along any other axis, which elongated side perimeter structural members contribute to supporting said reflection and concentrating surface 3 along at least portions of the perimeter of said reflection and concentrating surface, and which elongated side perimeter structural members also provide perimeter restraint to at least one of said transparent surface 5 and said bottom surface 7; and wherein said heliostatic control means 11 includes at least one of (i) electrically powered elevation control means 11E for orienting the inflatable heliostatic solar power collector 1 in elevation angle, and (ii) electrically powered azimuth control means 11A for orienting the inflatable heliostatic solar power collector 1 in azimuth angle.

The inflatable heliostatic solar power collector 1 is here seen with the support structure 8 including means 27 for fixedly engaging the supporting surface 10, support legs 8L, structural base ring 8B, rear support bar 32, curved connecting bars 34, and other components which together comprise bearing-connected means for supporting the combination of the bottom surface 7, the reflection and concentrating surface 3, the transparent surface 5 and the solar power receiver 2, so as to permit motion of said combination as commanded and controlled by the heliostatic control means.

Figure 3B:
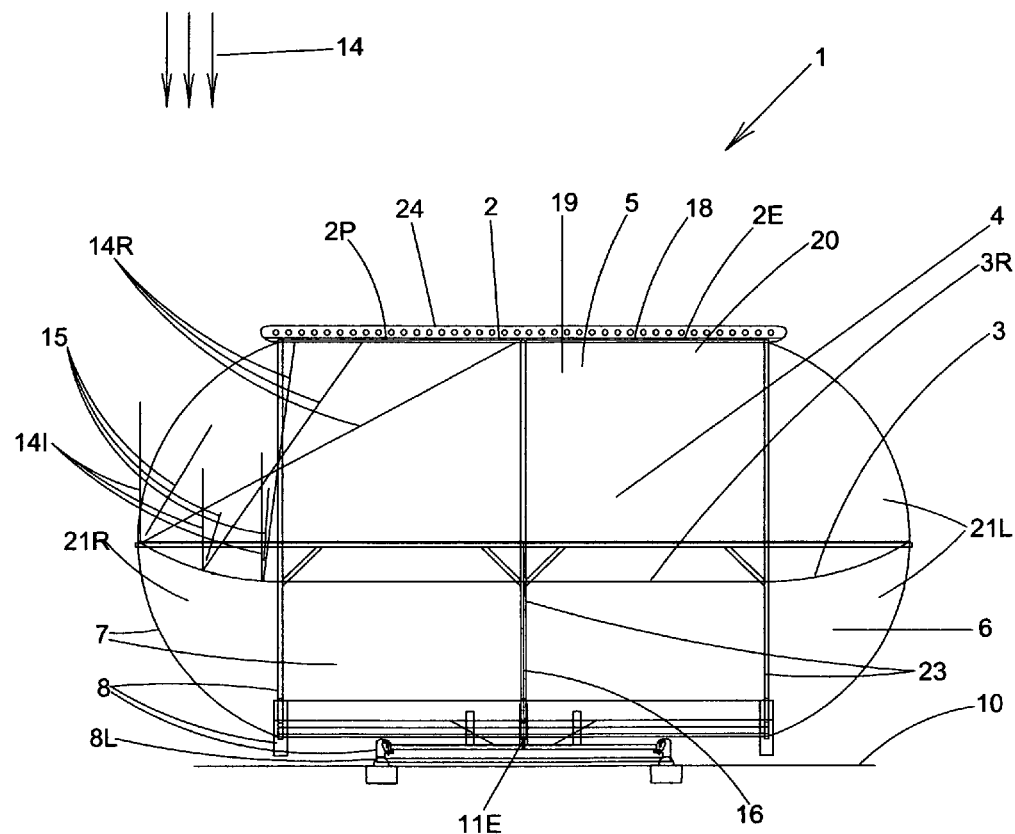
FIG. 3B shows the view and embodiment of FIG. 3A, further illustrating how sunrays are reflected to the solar power receiver.

FIG. 3B shows the view and embodiment of FIG. 3A, but further illustrates how representative incoming sunrays 14I are reflected around local normal vectors 15 to the reflection and concentrating surface 3, to proceed as representative reflected sunrays 14R to the solar power receiver 2. The upwardly concave desired shape of the reflection and concentrating surface 3 is at least in part maintained by the application of differential inflation pressure between the upper inflatable volume 4 and the lower inflatable volume 6, with an appropriate positive differential pressure contributing to imparting the upwardly concave desired shape. Note that the reflection and concentrating surfaces 3 in the left end closure portion 21L and the right end closure portion 21R are actually concave along two axes, to reflect light from these portions onto the narrow depth and along the long axis of the elongated solar power receiver 2E.

Figure 4A:
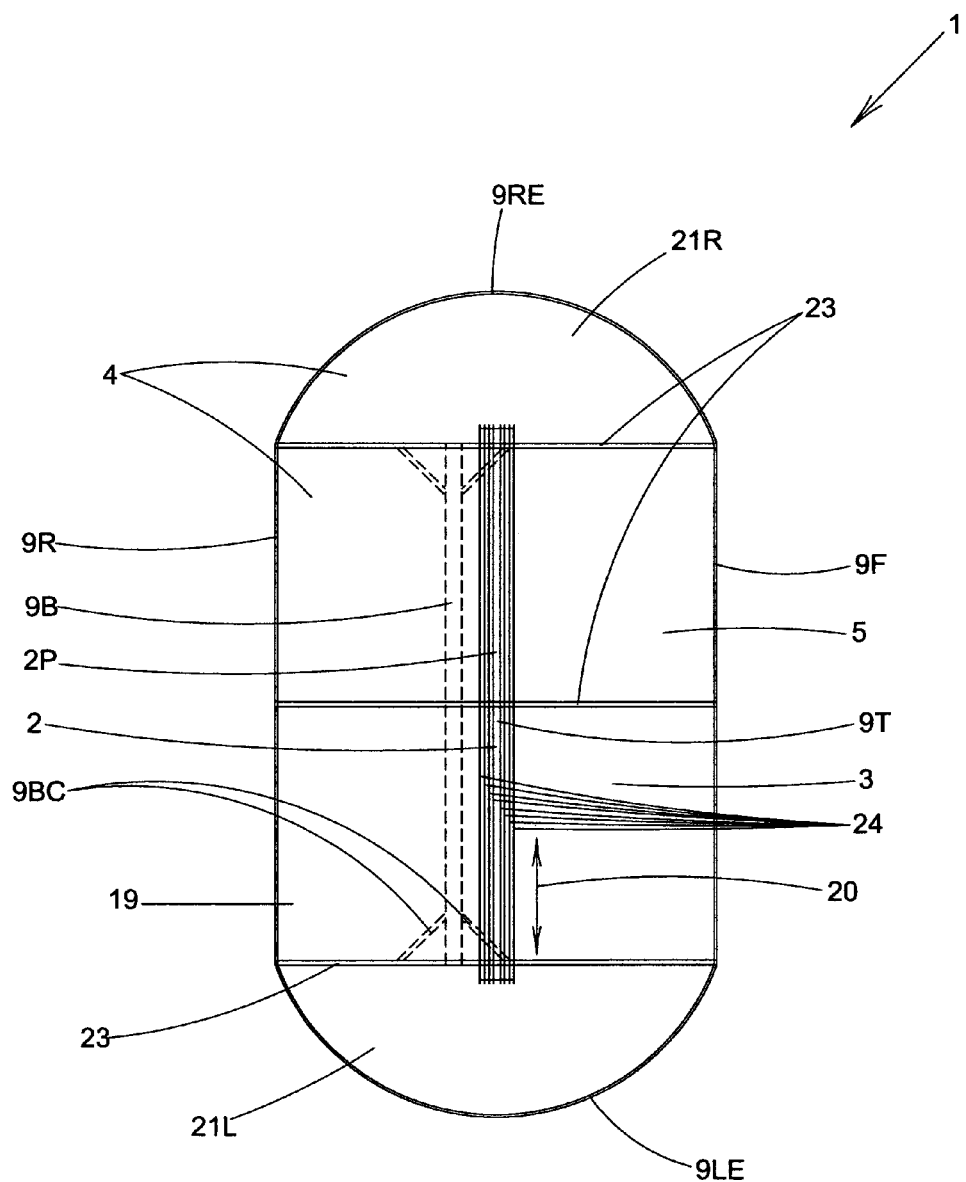
FIG. 4A shows a top view of the preferred embodiment of FIGS. 1A, 2A and 3A.

FIG. 4A shows a top view of the preferred embodiment of FIGS. 1A, 2A and 3A.

The inflatable heliostatic solar power collector 1 is illustrated, further comprising perimeter structural members including font frame member 9F, rear frame member 9R, bottom frame member 9B & optional bottom corner members 9BC, top frame member 9T, structural rings 23, left end frame member 9LE and right end frame member 9RE, all supporting said reflection and concentrating surface 3 along at least portions of the perimeter of said reflection and concentrating surface. The perimeter structural members also provide perimeter restraint to at least one of said transparent surface 5 and said bottom surface (not visible in this view as it lies below the reflection and concentrating surface 3).

The inflatable heliostatic solar power collector 1 comprises a solar power receiver 2 which is a photovoltaic receiver 2P, and further comprises means for cooling said photovoltaic receiver comprising at least one of cooling fins, blown air cooling, liquid cooling, and mixed phase boiling cooling—with cooling fins 24 shown in the illustrated embodiment. The use of multiple elongated cooling fins 24 to remove heat and reduce temperature for photovoltaic receiver/solar cell elements takes advantage of a large and distributed heat dissipation area to allow the solar cells to operate at lower temperatures where they are more efficient, especially for silicon solar cells.

Figure 4B:
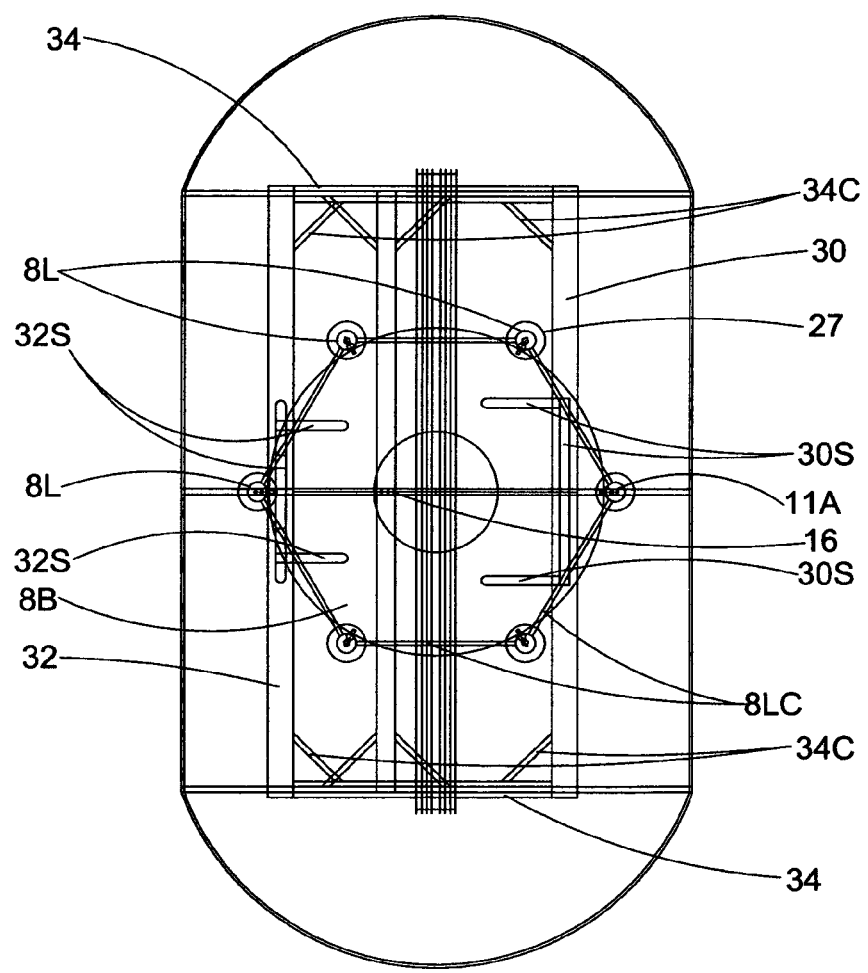
FIG. 4B shows a top view looking "through" the elements illustrated in FIG. 4A, to more clearly show the supporting structure beneath.

FIG. 4B shows a top view looking "through" the elements illustrated in FIG. 4A which are made "invisible" here but located in dotted lines, to more clearly show the supporting structure beneath such as the structural base ring 8B and additional support and heliostatic control elements. Six support legs 8L are shown in a hexagonal layout, with the rightmost of these also serving as the location of the azimuth control means 11A, as described in detail with reference to FIG. 1C. The support legs are connected to each other by optional leg connecting structure 8LC, in this hexagonal layout, while each support leg is secured in the supporting surface by means 27 for fixedly engaging the support surface, such as concrete base imbedding or Earth screws to name two known approaches. Note that in alternate embodiments, alternate numbers of support legs from 3 and up can be used, in lieu of the 6 shown here. The structural base ring 8B is supported by the support legs through bearing means that permit it to rotate as commanded to different azimuth orientations. The structural base ring 8B supports a front support bar 30 through front support bar supporting members 30S, which here comprise 3 substantially vertical panel-type structural members, but which may utilize truss or post type structural members in alternate embodiments. Similarly, the structural base ring 8B supports a rear support bar 32 through rear support bar supporting members 32S, which here also comprise 3 different substantially vertical panel-type structural members, but which may utilize truss or post type structural members in alternate embodiments.

For clarity, the full elevation control system is not shown in FIG. 4B, but the group 16 consisting of a chain and a cable is shown, lying along a path corresponding to the center of the three structural rings 23. In alternate embodiments, the elevation control can be accomplished through chain/cable means or gear means, acting on any or all of the 3 structural rings shown; and in still other variant embodiments with other numbers of structural rings implemented, acting on any or all of that number of structural rings.

Figure 4C:
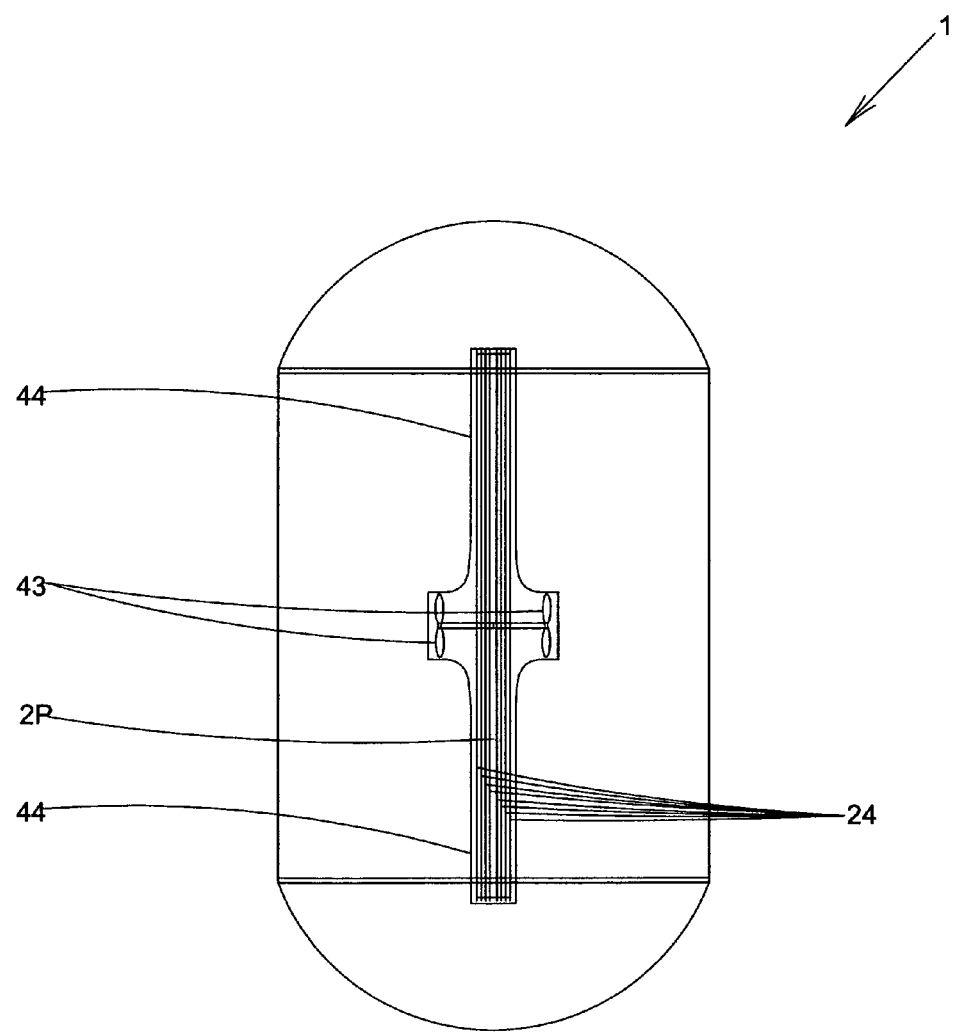
FIG. 4C shows a top view of an embodiment very similar to that of FIG. 4A, but with fan forced cooling.

FIG. 4C shows a top view of an embodiment very similar to that of FIG. 4A, but with fan forced cooling rather than cooling by the cooling fins 24 with no forced airflow implementation. Thus this variant embodiment provides means for cooling the photovoltaic receiver 2P comprising at least one of cooling fins, blown air cooling, liquid cooling, and mixed phase boiling cooling—specifically blown air cooling in this particular illustration. The air is blown by front and rear fans 43 which may be electrically powered fans using a small fraction of the electric power generated by the photovoltaic receiver 2P. The electric fan motor is not shown, but any number of motors known from the prior art could be used, and drive the fans either through a single connecting shaft as shown (with fans blade pitch and twist set to produce flow in opposite directions) or through alternate drivetrain means. There is also an airflow tube 44 with left and right sides covering the cooling fins 24, so if the fans are blowing outwards air is sucked in from the left and right ends of the airflow tube and forced along the length of the cooling fins until it is blown outwards near the center of the cooling fin assembly. In alternate embodiments the fans may blow inward rather than outward. The walls of the airflow tube may be transparent, to allow incident sunlight to pass through the airflow tube to the reflection and concentrating surface 3, with reduced shadowing losses.

Figure 4D:
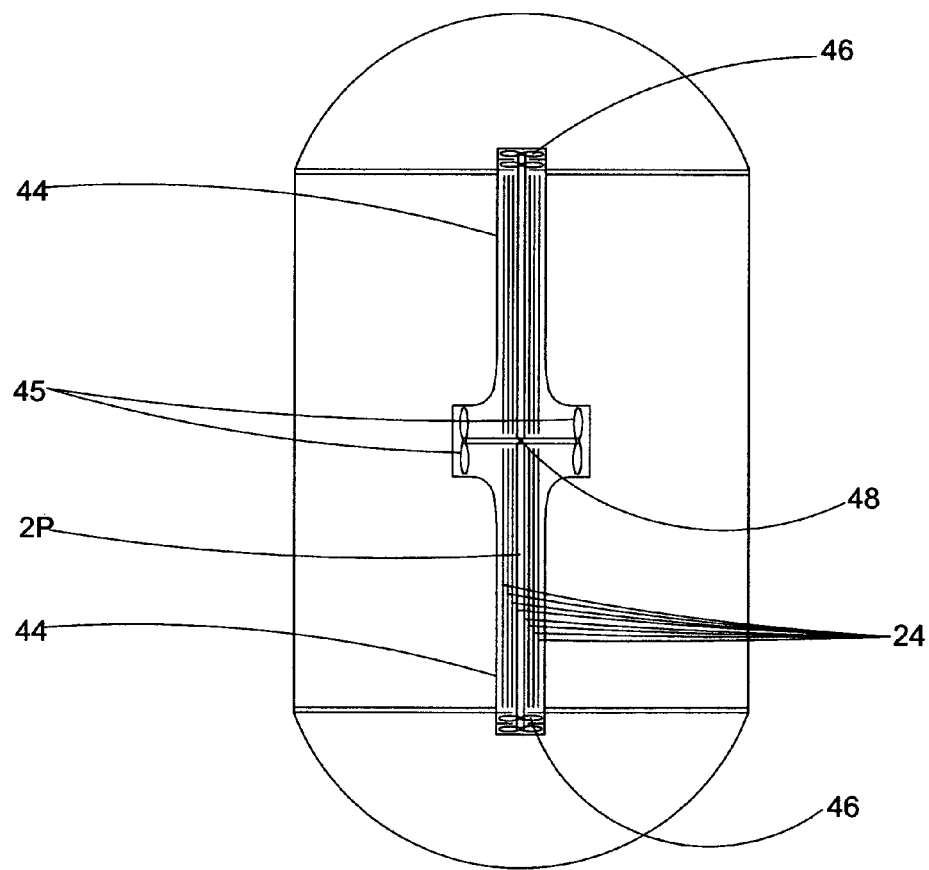
FIG. 4D shows a top view of an inflatable heliostatic solar power collector wherein the solar power receiver is a combined photovoltaic receiver and solar thermal receiver.

FIG. 4D shows a variant embodiment similar to FIG. 4C, with means for cooling the photovoltaic receiver comprising at least one of cooling fins, blown air cooling, liquid cooling, and mixed phase boiling cooling; wherein the illustrated cooling fins 24 serve dual purposes of (i) removing heat from the photovoltaic receiver 2P to enable a lower temperature and higher efficiency of the photovoltaic receiver (e.g., for many silicon based solar cells, temperatures below around 55 to 70 degrees C.); and (ii) adding that heat to a solar thermal engine and powerplant integrated into this variant solar power collector 1.

FIG. 4D shows the inflatable heliostatic solar power collector 1, wherein the solar power receiver is a combined photovoltaic receiver and solar thermal receiver; and wherein incoming sunrays from a sunward direction will be reflected and concentrated by said reflection and concentration surface onto said photovoltaic receiver, and wherein waste heat from said photovoltaic receiver is conducted as a heat flow to an adjacent solar thermal receiver on the opposite side of said photovoltaic receiver as the light receiving side of the photovoltaic receiver.

Thus the embodiment of FIG. 4D provides an inflatable heliostatic solar power collector 1, wherein a solar thermal receiver utilizes solar thermal heat flow to power a thermodynamic cycle engine comprising at least one of a Brayton cycle engine, a Rankine cycle engine, a Sterling cycle engine and an Otto cycle engine—in the illustrated embodiment a Brayton cycle engine with air flowing in through a compressor 46, being heated by the heat from the cooling fins 24, then flowing out through turbines 45, which in turn drive a drivetrain and generator 48 which both produces solar thermal electricity and drives the compressor. This embodiment thus produces both photovoltaic power and solar thermal power in a hybrid and integrated device, with the solar thermal part using a gas turbine engine with heat provided by "waste heat" from the photovoltaic receiver, as opposed to combustion processes in conventional gas turbine engines such as aircraft jet engines or gas turbine powered electric generators used in certain electric power utility installations.

The solar thermal generator can optionally be run "backwards" to start the compressor and turbines rotating when the solar thermal powerplant is just started up, as in morning or after recovering from a period of cloud cover back into sunshine conditions. Also, an axial compressor configuration is shown, while in alternate embodiments a centrifugal or combined centrifugal+axial compressor could be used. Finally, a single stage turbine is shown, while in alternate embodiments multi-stage turbines could be used.

Figure 5A:
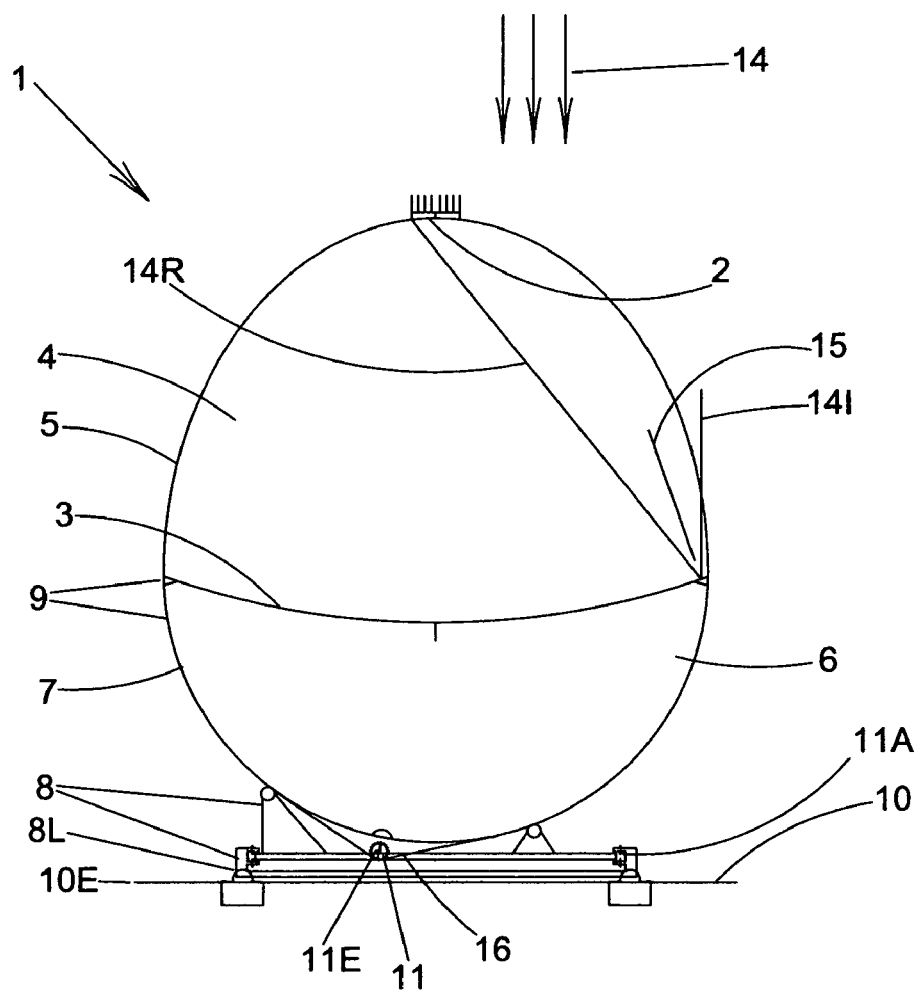
FIG. 5A shows a left end view of an embodiment with a noncircular inflatable cross-section.

FIG. 5A shows a similar view of an alternate embodiment similar to that shown in FIG. 1B, but with a noncircular inflatable cross-section, where the upper inflatable volume 4 is now taller than it is wide, in this view. The sectional shape of the transparent surface 5 is now oval or elliptical rather than circular in shape. The reflection and concentrating surface 3 has a less sharply concave upward shape than the embodiment of FIG. 1B, to achieve a similar concentration function onto the solar receiver 2, which is now at a greater focal distance from the reflective surface.

FIG. 5A also illustrates the inflatable heliostatic solar power collector 1, wherein said heliostatic control means includes at least one of an electrically powered motor, a linear actuator, and a stepper motor—wherein the illustrated embodiment shows a linear actuator 12A. This particular linear actuator installation may also have a supplementary angular actuator (such as the illustrated rotary actuator) to command the direction of orientation of the linear actuator as it goes through "bottom dead center".

Figure 5B:
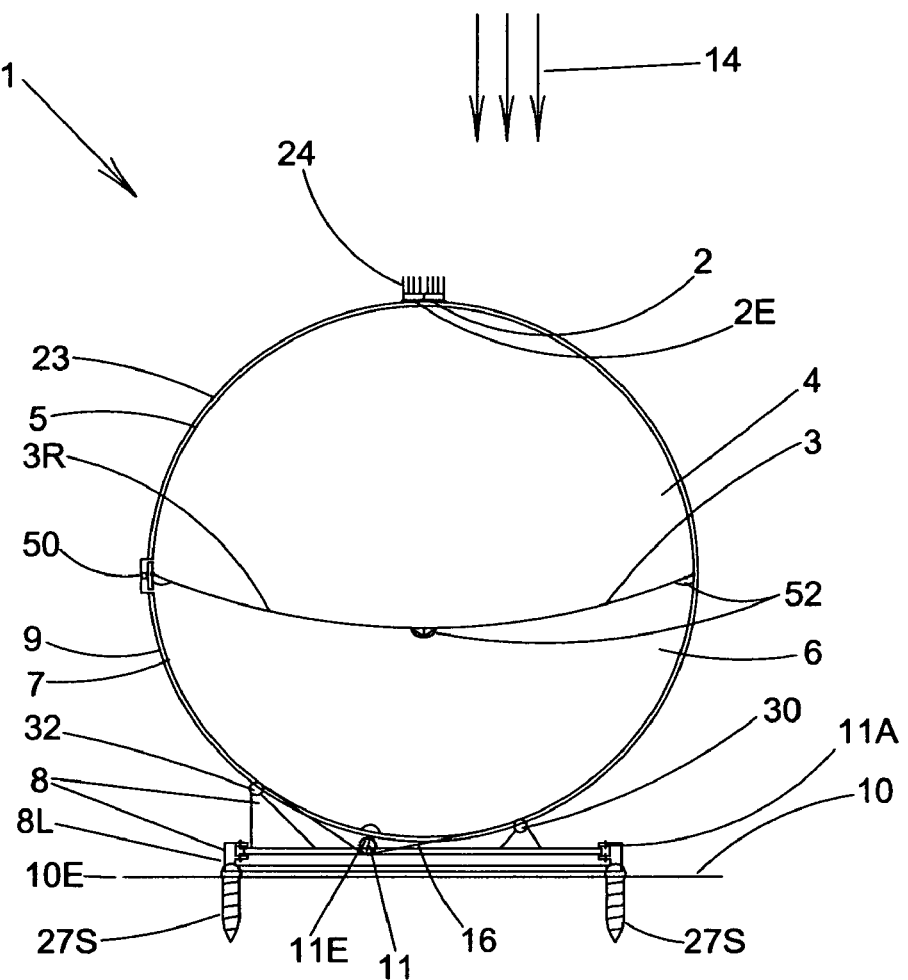
FIG. 5B shows a left end view of an inflatable heliostatic solar power collector further comprising means for performing inflation control.

FIG. 5B illustrates an inflatable heliostatic solar power collector 1, further comprising means for performing inflation control 50 including at least one of means for increasing, means for maintaining, means for decreasing, and means for controllably adjusting inflation pressure, in at least one of said upper inflatable volume 4 and said lower inflatable volume 6. The illustrated means for performing inflation control further includes at least one of an inflation valve, a deflation valve, and an air pump.

FIG. 5B further illustrates an inflatable heliostatic solar power collector 1, wherein the reflection and concentrating surface 3 is contacted by at least one of adjacent shaping means for contributing to a desired shape of said reflection and concentrating surface, and damping means for damping undesirable motions of said reflection and concentrating surface—here comprising viscoelastic damping material 52 on the nonreflective underside of the reflection and concentrating surface 3.

FIG. 5B also shows the use of screw anchors 27S, as means for fixedly engaging the supporting surface 10, here an Earth surface 10E.

Figure 5C:
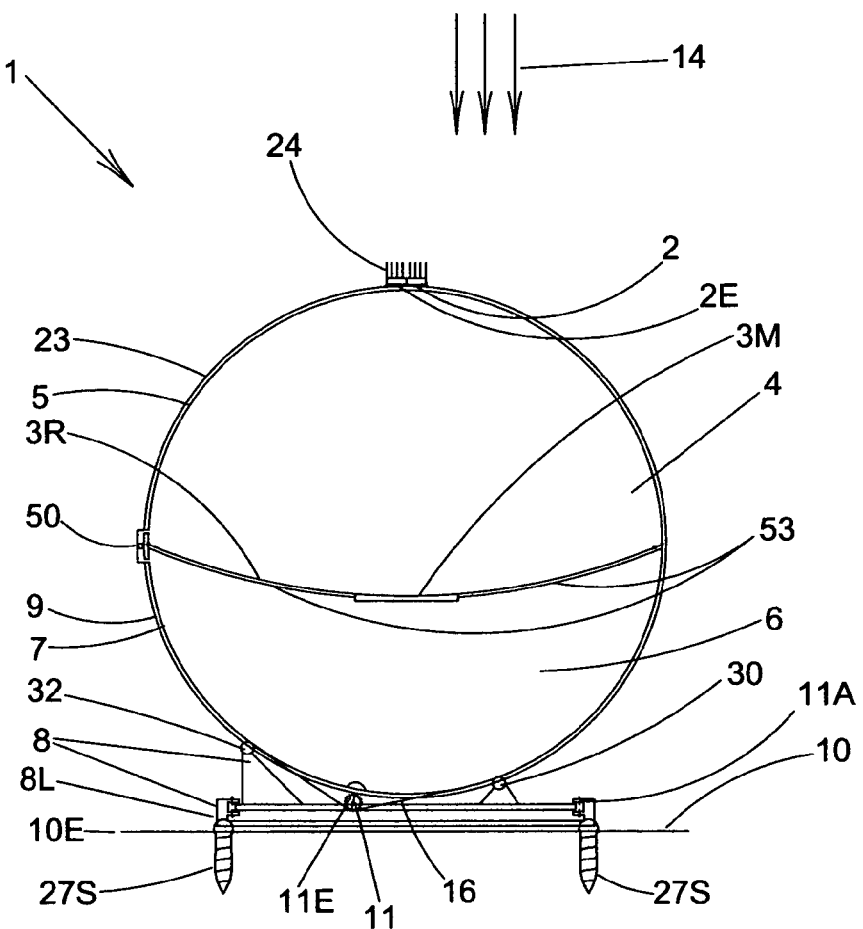
FIG. 5C shows a left end view of an embodiment with a substantially parabolic "semirigid" shaped reflection and concentrating surface.

FIG. 5C shows another embodiment similar to that of FIG. 5B, but now with a substantially parabolic "semirigid" shaped reflection and concentrating surface 3 as well as a semirigid or rigid transparent surface 5. The substantially parabolic shape is here achieved by the use of a substantially rigid mirror element 3M with a parabolic shape reflective surface, and with reflective membrane 3R on either side of the mirror element, with shaping means 53 here comprising membrane shaping ribs on the bottom, nonreflective sides of the reflective membranes, to impart an approximately parabolic shape to the reflective membrane portions of the reflection and concentrating surface 3.

Thus FIG. 5C provides an inflatable heliostatic solar power collector 1, wherein said reflection and concentrating surface 3 includes at least one of (i) a reflective membrane which is reflective on its upper side and (ii) a mirror element—in the illustrated embodiment mirror element 3M. The illustrated embodiment also shows an inflatable heliostatic solar power collector 1, wherein said reflection and concentrating surface 3 is contacted by adjacent shaping means 53 for contributing to a desired shape of said reflection and concentrating surface.

Figure 5D:
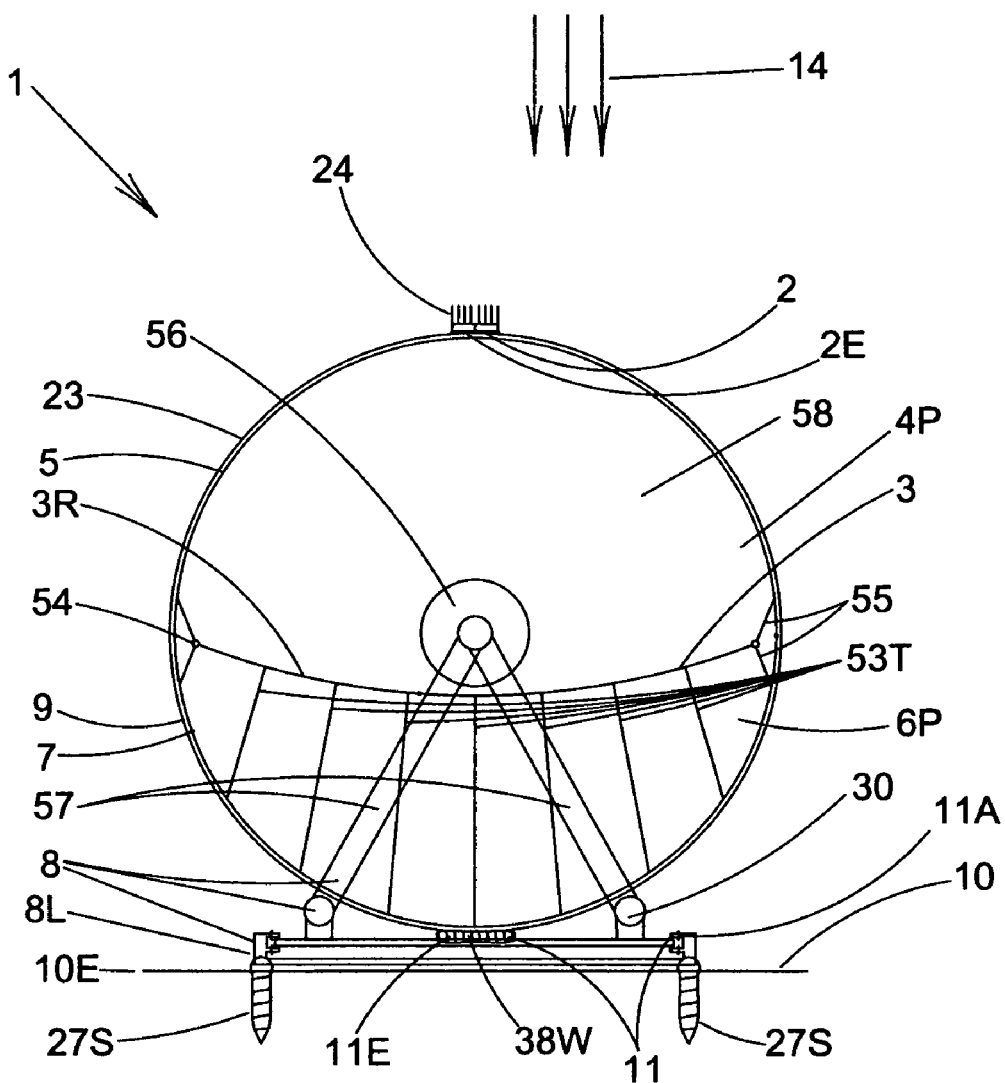
FIG. 5D shows a left side cross-sectional view of an embodiment of the invention wherein the reflection and concentrating surface is shaped in part by the effect of shaping tension elements.

FIG. 5D shows a left side cross-sectional view of another embodiment of the invention. In this embodiment the reflection and concentrating surface has no pressure differential across it, but is shaped in part by the effect of shaping tension elements 53T such as tethers, in part by fabrication of an inherent shape into the membrane, and in small part by gravitational forces. The reflection and concentrating surface 3 is a reflective membrane 3R, supported around its perimeter by a reflective surface perimeter ring 54. The perimeter ring 54 is in turn supported by perimeter ring positioning elements 55, which may be tether, rod or trusswork elements.

FIG. 5D thus shows an inflatable heliostatic solar power collector 1, comprising: an inflatable volume with a substantially constant cross-section 58; a solar power receiver 2 at the top of said cross-section when the Sun is directly overhead (as shown with incoming vertical sunrays 14); a reflection and concentrating surface 3 traversing said cross-section and dividing said inflatable volume into an upper part 4P and a lower part 6P; a transparent surface 5 above said upper part; a bottom surface 7 below said lower part; end cap means 56 for closing the two ends of said inflatable volume outward from the end planes bounding the constant cross-section portion of the inflatable heliostatic solar power collector 1; and heliostatic control means 11 for aiming said solar power collector as a function of at least one of time and other parameters, such that incoming sunrays 14 from a sunward direction will be reflected and concentrated by said reflection and concentration surface 3, onto said solar power receiver 2 at a concentration ratio of at least 2 suns. Note that while the upper part 4P and lower part 6P of the inflated volume with substantially constant cross-section 58 are connected in the illustrated embodiment, in alternate embodiments they may be separate and distinct, unconnected parts in the sense that air could not move freely between these two parts.

The inflatable heliostatic solar power collector 1 of FIG. 5D further comprises a plurality of cross-section perimeter enclosing structural rings 23 (one seen in this view) which can contribute to restraining said transparent surface 5 and said bottom surface 7 against inflation-induced forces arising from inflation of the upper part 4P and the lower part 6P of said inflatable volume.

The heliostatic control means 11 includes elevation control means 11E for engaging and precisely rotating at least one of said structural rings 23 to effect elevation angle control of said solar power collector; and powered elevation control means are provided which comprise a powered gear (here the elevation angle control worm gear 38W) engaging and driving a gear element on (the outer face of) a structural ring 23 engaging said transparent surface 5 and said bottom surface 7 and enclosing a region which includes portions of said upper inflatable volume 4P and said lower inflatable volume 6P. The structural rings 23 and inflatable skins 5 and 7 are connected to and supported by the end cap means 56 in this illustrated embodiment, with elevation rotation bearings between the end cap means 56 and the end cap support bars 57.

FIG. 5D further illustrates the inflatable heliostatic solar power collector 1, wherein said reflection and concentrating surface 3 is contacted by adjacent shaping means 53 for contributing to a desired shape of said reflection and concentrating surface 3 and wherein said adjacent shaping means 53 comprises connected shaping tension elements.

Figure 6A:
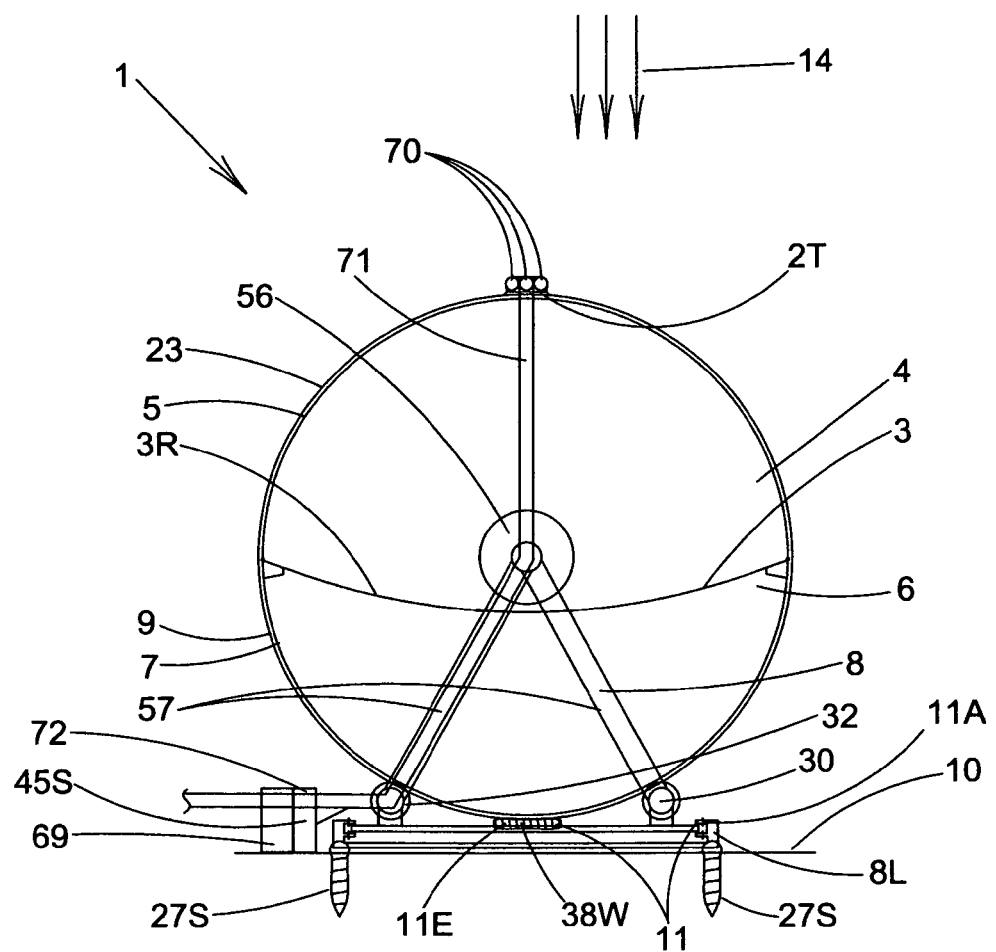
FIG. 6A shows a left side view of an embodiment of the invention with a solar thermal receiver.

FIG. 6A shows a left side view of an embodiment of the invention with a solar thermal receiver that receives concentrated reflected solar radiation and utilizes that solar power to boil water pumped by a recirculation pump 72 through transport tubes and through boiling tubes 70 with light absorbing lower surfaces, such as black painted metal. The water is boiled in the boiling tubes, and the resulting steam is transported through other transport tubes 71 (possibly concentric with the incoming water tubes) either directly to an end user or customer which desires heat (e.g., for home heating or building heating or swimming pool heating or industrial process heat); or optionally through a steam turbine module 45S connected to a steam turbine driven power generator 69. The use of an elongated solar thermal receiver 2T enables boiling of water flowing in the boiling tubes even with lower levels of incoming solar radiation, as heat is added to the flowing water over an elongated flow path. Depending on levels of solar radiation, appropriate steam generation and heat and temperature profiles along the boiling tubes can be achieved by varying flow rate through these boiling tubes, and by use of different size boiling tubes for potential different locale applications with different average levels of solar insolation.

FIG. 6A shows an inflatable heliostatic solar power collector 1, wherein the solar power receiver is a solar thermal receiver 2T, and further comprising means for conveying thermal power (transport tubes 71) from said solar power collector to a destination for the beneficial use of said thermal power.

The optional steam turbine module 45S in conjunction with the recirculation pump 72, transport tubes, and boiling tubes 70 at the solar thermal receiver 2T, together comprise thermodynamic engine means for converting a portion of the output of the solar thermal receiver 2T into motion (at the steam turbine shaft output), and further comprise optional electrical power generation means for converting a portion of said motion into electrical power (in the steam turbine driven power generator 69). The inflatable heliostatic solar power collector 1, has a solar thermal receiver 2T that utilizes solar thermal heat flow to power a thermodynamic cycle engine comprising at least one of a Brayton cycle engine, a Rankine cycle engine, a Sterling cycle engine and an Otto cycle engine—specifically a Rankine or steam cycle engine in the illustrated embodiment.

Figure 6B:
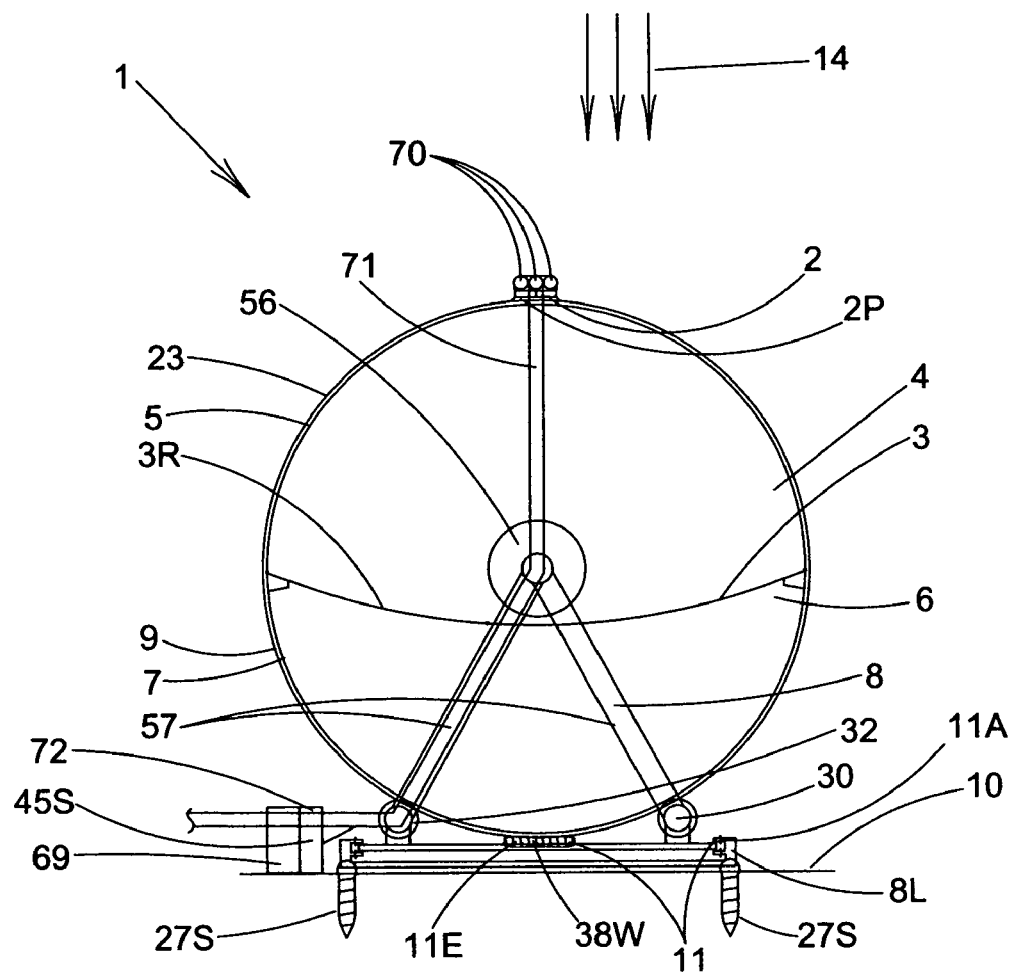
FIG. 6B shows a left side view of a variant embodiment with a combined photovoltaic and solar thermal receiver and powerplant.

FIG. 6B shows a variant embodiment to that of FIG. 6A, with a combined photovoltaic and solar thermal receiver and powerplant. This embodiment features means for cooling the photovoltaic receiver comprising mixed phase boiling cooling; wherein the illustrated boiling tubes 70 serve dual purposes of (i) removing heat from the photovoltaic receiver 2P to enable a lower temperature (e.g., typically around 100 deg C. or the boiling point of water, for advanced material concentrating solar cells) and potentially higher efficiency of the photovoltaic receiver; and (ii) adding that heat to a solar thermal engine and powerplant integrated into this variant solar power collector 1.

FIG. 6B thus shows the inflatable heliostatic solar power collector 1, wherein the solar power receiver 2 is a combined photovoltaic receiver 2P and solar thermal receiver; and wherein incoming sunrays from a sunward direction will be reflected and concentrated by said reflection and concentration surface 3 onto said photovoltaic receiver 2P, and wherein waste heat from said photovoltaic receiver is conducted as a heat flow to an adjacent solar thermal receiver utilizing boiling tubes 70 on the opposite side of said photovoltaic receiver as the light receiving side of the photovoltaic receiver.

Thus the embodiment of FIG. 6B provides an inflatable heliostatic solar power collector 1, wherein a solar thermal receiver utilizes solar thermal heat flow to power a thermodynamic cycle engine comprising at least one of a Brayton cycle engine, a Rankine cycle engine, a Sterling cycle engine and an Otto cycle engine—in the illustrated embodiment a Rankine or steam cycle engine with steam from boiling tubes 70 flowing in out through steam turbines 45S, which in turn drive a drivetrain and generator 48 which both produces solar thermal electricity and drives the recirculation pump 71. This embodiment thus produces both photovoltaic power and solar thermal power in a hybrid and integrated device, with the solar thermal part using a steam engine with heat provided by "waste heat" from the photovoltaic receiver. Hybrid installations where the steam engine continues to run using heat from a fossil fuel or other nonsolar boiler during periods of night or cloud cover, are also possible with known adaptations of this embodiment. While mixed phase boiling is shown, in alternate embodiments Rankine cycles can be used with superheated steam as the working fluid.

Figure 6C:
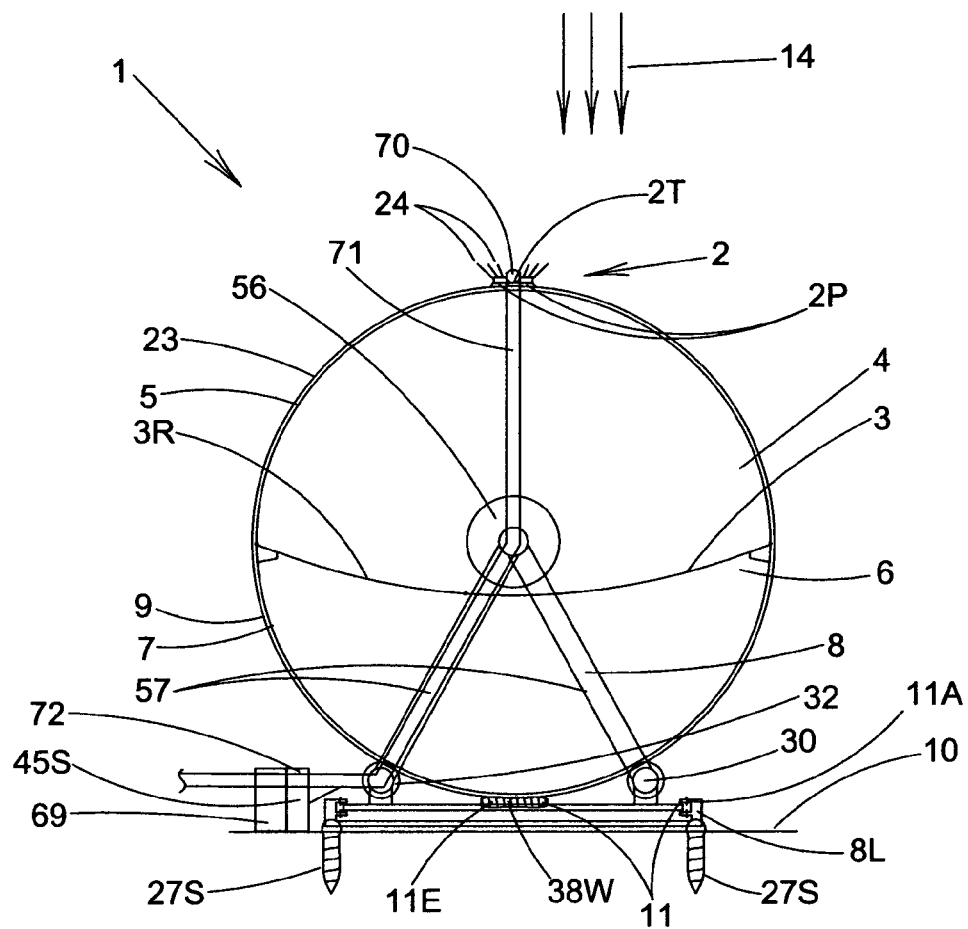
FIG. 6C shows a left side view of another embodiment with photovoltaic elements on either side of a solar thermal element.

FIG. 6C shows another embodiment with combined photovoltaic and solar thermal receiver elements, but this time with photovoltaic elements on either side of a solar thermal element.

The inflatable heliostatic solar power collector 1, features a solar power receiver 2 which is a combined photovoltaic receiver 2P and solar thermal receiver 2T, and wherein the elongated solar power receiver includes an elongated solar thermal receiver portion with elongated photovoltaic receiver portions disposed on either side of the elongated solar thermal receiver portion, as illustrated (axis of elongation into the page in this view).

The Inflatable Heliostatic Solar Power Collector of Claim 7, FIG. 6C also shows means for cooling the photovoltaic receivers 2P comprising at least one of cooling fins, blown air cooling, liquid cooling, and mixed phase boiling cooling, with cooling fins 24 illustrated but any of the other cooling options being possible in variant embodiments. With this layout of photovoltaic receiver elements straddling on either side of a solar thermal receiver, another conducive option would be to run cooling tubes with liquid, e.g. water from the recirculation pump, over the photovoltaic receiver to provide liquid cooling, while preheating the water before it runs through the boiling tube 70 for the solar thermal part of the receiver.

Figure 7A:
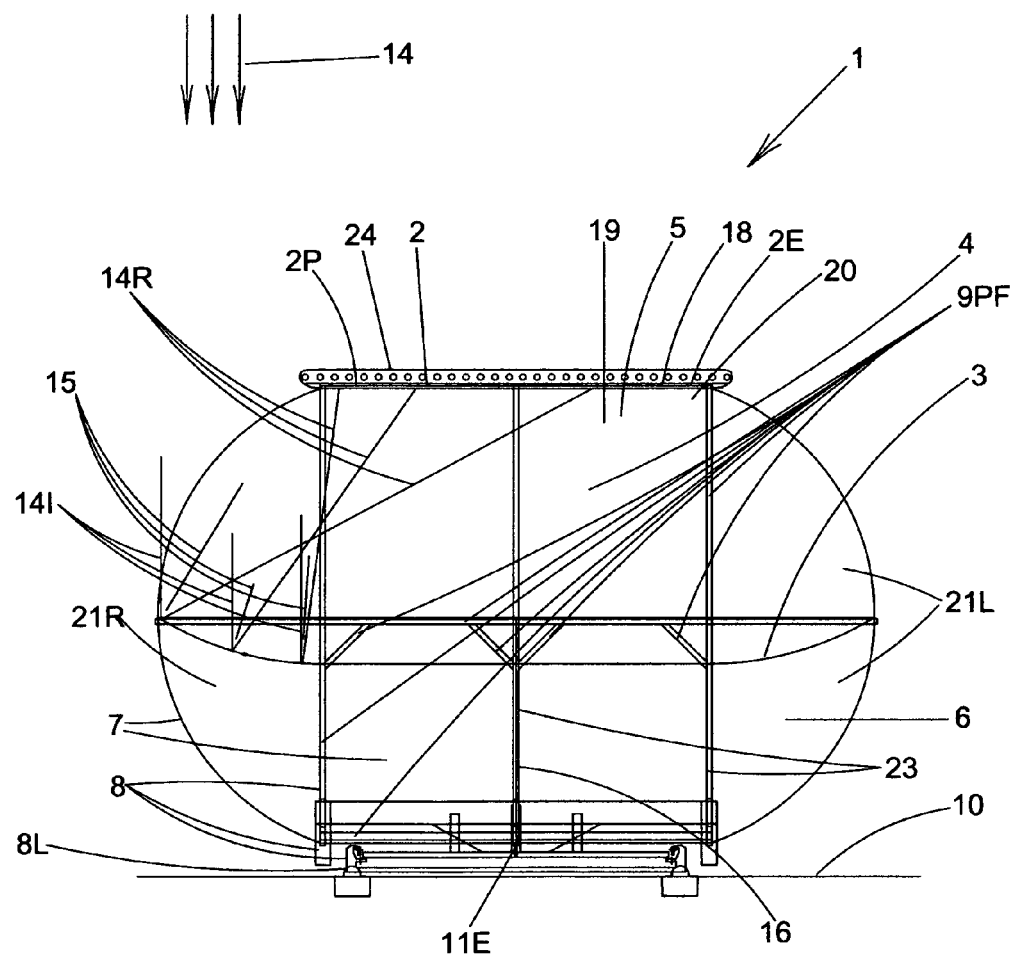
FIG. 7A shows a rear view of an embodiment of an inflatable heliostatic solar power collector wherein the support structure includes permanently connected elongated framing members forming a framework around an upper inflatable volume and a lower inflatable volume.

FIG. 7A shows a rear view of another embodiment of an inflatable heliostatic solar power collector 1, wherein the support structure 8 includes permanently connected elongated framing members forming a framework 9PF around the upper inflatable volume 4 and lower inflatable volume 6. This embodiment has a less wide constant cross-section portion than the corresponding embodiment of FIG. 3B.

Figure 7B:
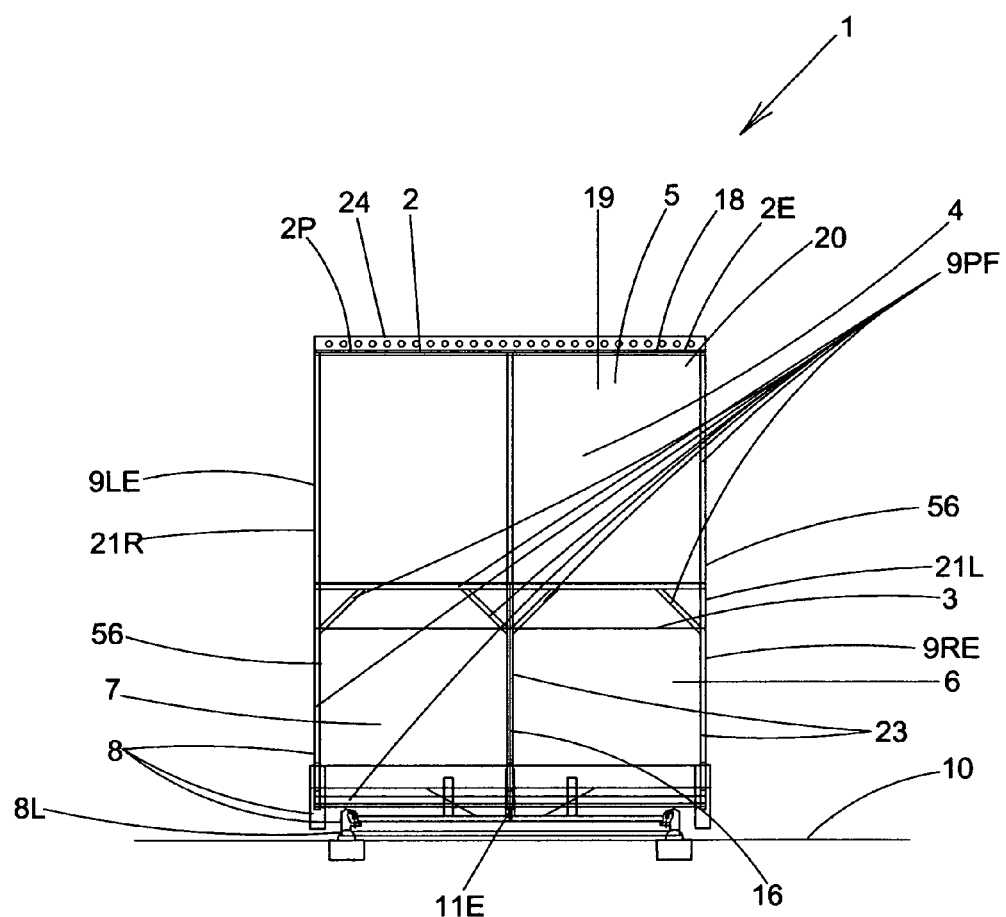
FIG. 7B shows a rear view of an embodiment with flat end caps comprising rigid flat pressure bulkheads at the left and right end frame members.

FIG. 7B shows an embodiment similar to FIG. 7A, but with flat end caps rather than domed end caps. The flat end cap means 56 here comprise the left end frame member 9LE and right end frame member 9RE, which are rigid flat pressure bulkheads.

Figure 7C:
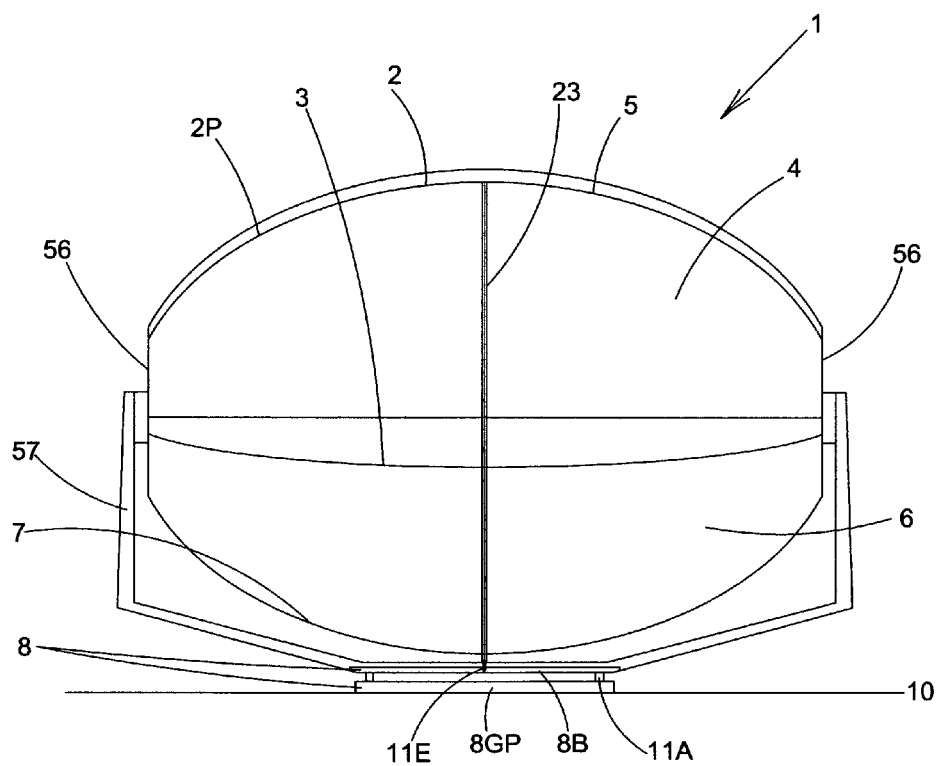
FIG. 7C shows a front view of an embodiment wherein the inflatable heliostatic power collector 1 is in the approximate shape of an ellipsoid, with ends truncated.

FIG. 7C shows a front view of an embodiment wherein the inflatable heliostatic power collector 1 is in the approximate shape of an ellipsoid, with ends truncated by end cap means 56 connected through elevation angle change permitting hinge means to end cap support bars 57. The solar power receiver 2 is still an elongated member, but curved to follow along the crown line of the ellipsoid and with a front to back (into the page) depth that increases near the center of the receiver. A single central structural ring 23 is provided, with the elevation control means 11E engaging this structural ring 23. The structural ring 23 can be a single piece or a multipiece ring, and made of metallic, plastic, composite or hybrid material construction. The upper inflatable volume 4 is bounded above by a transparent surface 5, and bounded below by the reflection and concentration surface 3, which now has appropriate curvature in two axes to appropriately reflect and focus incident sunlight onto the solar power receiver 2. The lower inflatable volume 6 is bounded on top by the underside of the reflection and concentrating surface 3, and bounded below by the bottom surface 7.

The end cap support bars 57 are connected to and supported by a structural base ring 8B, which in turn is supported by ground plate means 8GP via azimuth control means 11A, which rotate and control the base plate 8B in azimuth angle.

Figure 8:
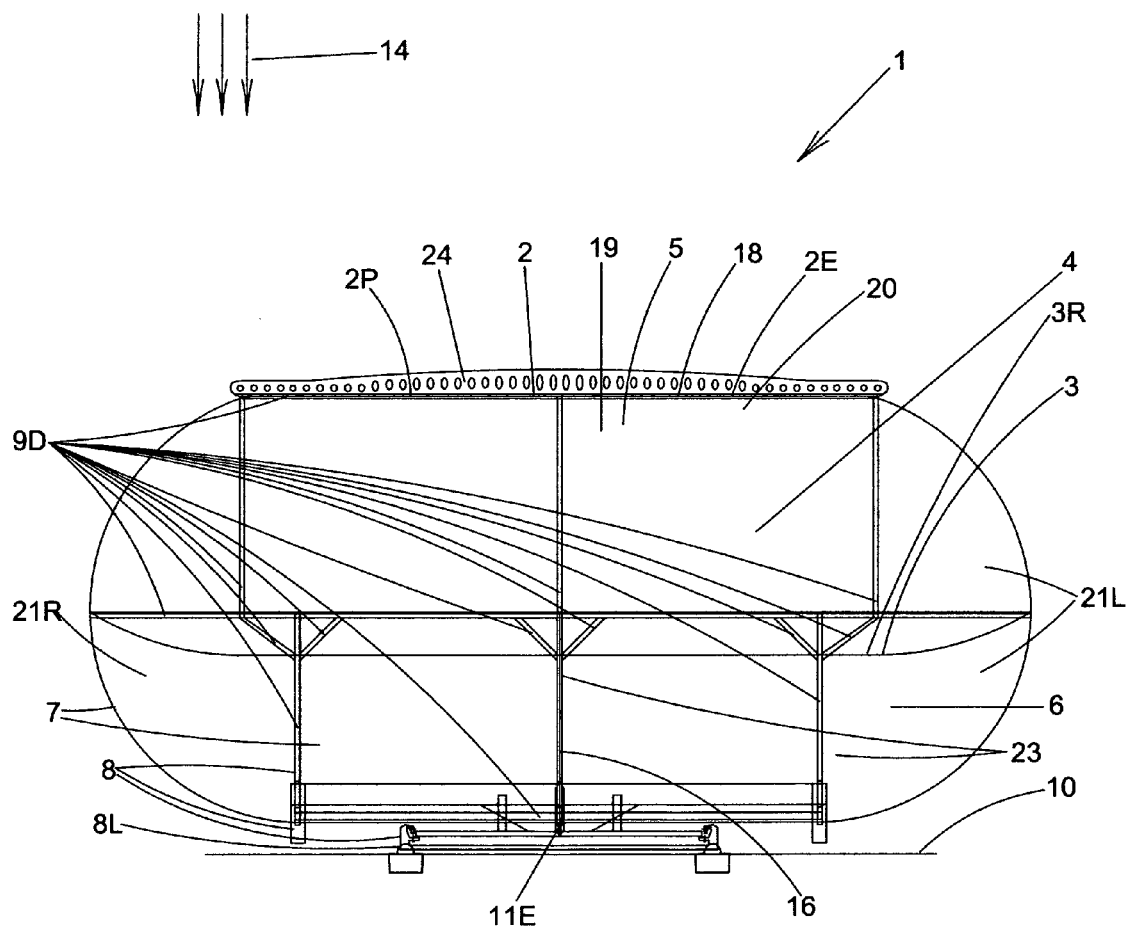
FIG. 8 shows a rear view of an embodiment of a more elongated inflatable heliostatic solar power collector, wherein the support structure includes detachably connected elongated framing members.

FIG. 8 shows an embodiment of an inflatable heliostatic solar power collector 1, wherein the support structure 8 includes detachably connected elongated framing members 9D forming a framework around the upper inflatable volume 4 and lower inflatable volume 6. The detachably connected elongated framing members 9D can have any of numerous known detachable connection means, including fastener means such as nut and bolt connectors, detachable adhesive-connected joints, nesting tube joints, tongue and groove joints, etc. Note also that the embodiment of FIG. 8 provides an inflatable heliostatic solar power collector 1 which is wider and has more reflective area than the embodiment of FIG. 3B,
through the use of staggered upper outboard framing members relative to their lower outboard framing member counterparts, with corner fittings transferring load across the staggered frame geometry. The combination of the elongated framing members and the corner fittings provide for a rigid, truss-like and cage-like structure connected to the flexible or membranous inflatable structure members, together to be able to resist wind loads and precipitation loads. Note that the embodiment of FIG. 8 also has a nonlinear geometry for the cooling fins 24, and noncircular air holes in these cooling fins, to enable needed heat dissipation in the higher heat load central region of the elongated solar power receiver 2E.

Figure 9A:
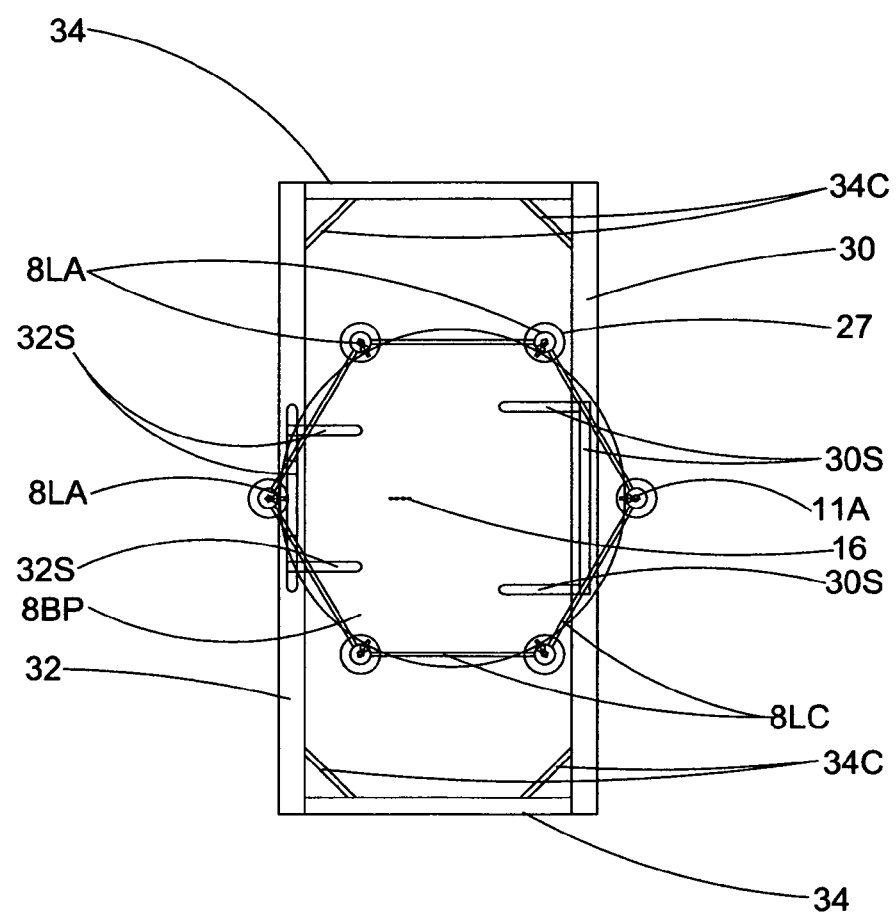
FIG. 9A shows a top view of an embodiment with a structural base plate.

FIG. 9A shows a top view of an embodiment similar to that shown in FIG. 4B, but with the structural base ring 8B replaced by a structural base plate 8BP. Adjustable support legs 8LA are shown, which allow precise adjustment of the base plane of the inflatable heliostatic solar power collector; calibration via a calibration computer or microprocessor; and adjustment for sloping surface installation such as on a pitched roof surface of a building.

Figure 9B:
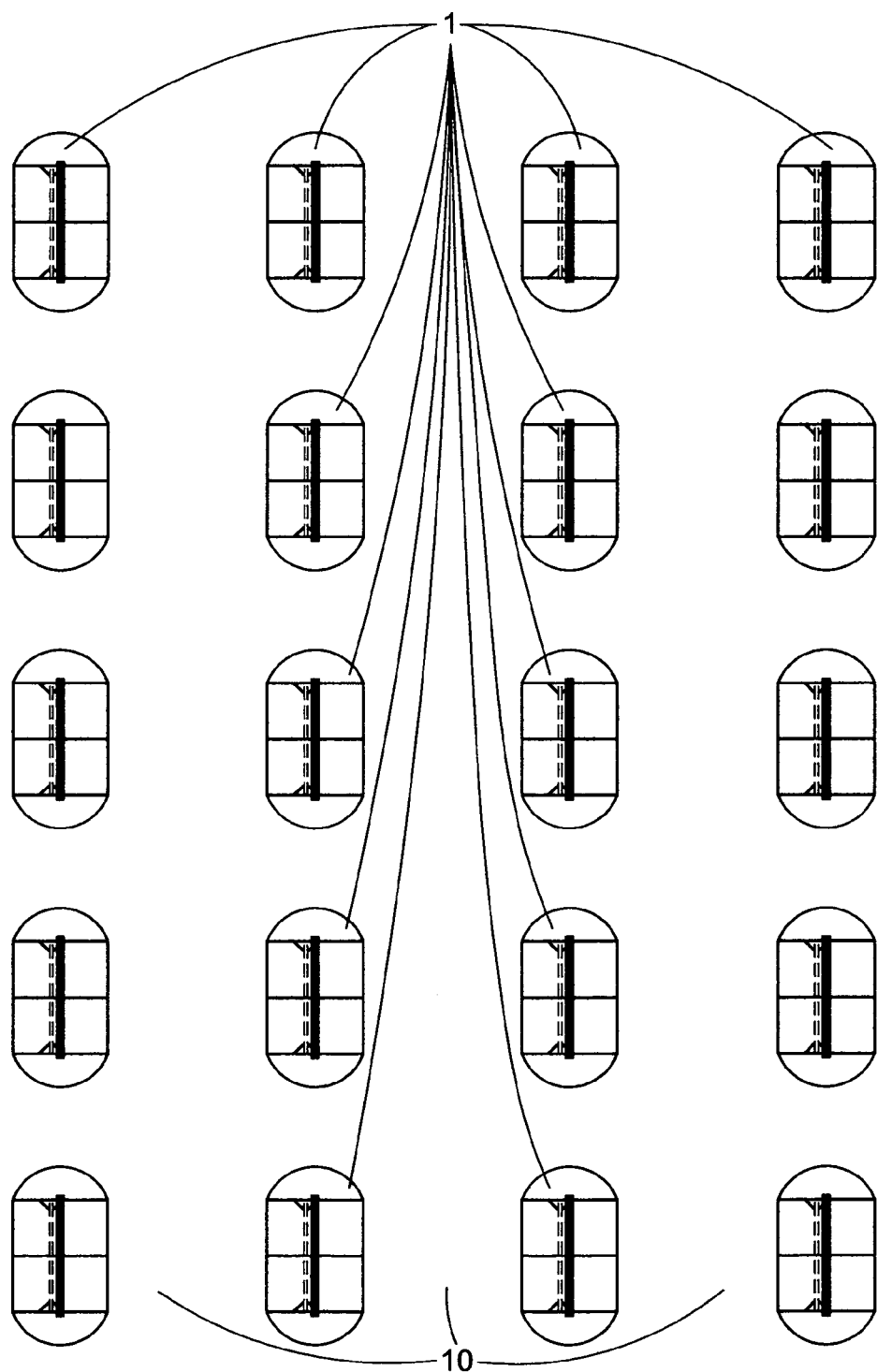
FIG. 9B shows a top view of an arrangement of inflatable heliostatic solar power collectors in an array on a supporting surface such as a ground surface or a building roof.

FIG. 9B shows a top view of an arrangement of inflatable heliostatic solar power collectors 1 similar to the embodiment shown in FIG. 4B, in a rectangular array as illustrated on a supporting surface such as a ground surface or a building roof. Note that siting on a building roof is very feasible for these lightweight inflatable heliostatic solar power collectors 1, as they do not put much of a weight load on that surface. In alternate embodiments the spacing along the different axes of the array can be varied, to balance objectives of higher density of installation to maximize solar power generated per unit surface area of ground or roof, versus reduced occurrences of shadowing of collectors by other collectors and as a function of latitude, surface slope, North orientation and possibly other parameters. In still other alternate embodiments, triangular, hexagonal, arc and spoke, or other regular or irregular arrays or arrangements of inflatable heliostatic solar power collectors can be used, within the spirit and scope of the invention.

Figure 10A:
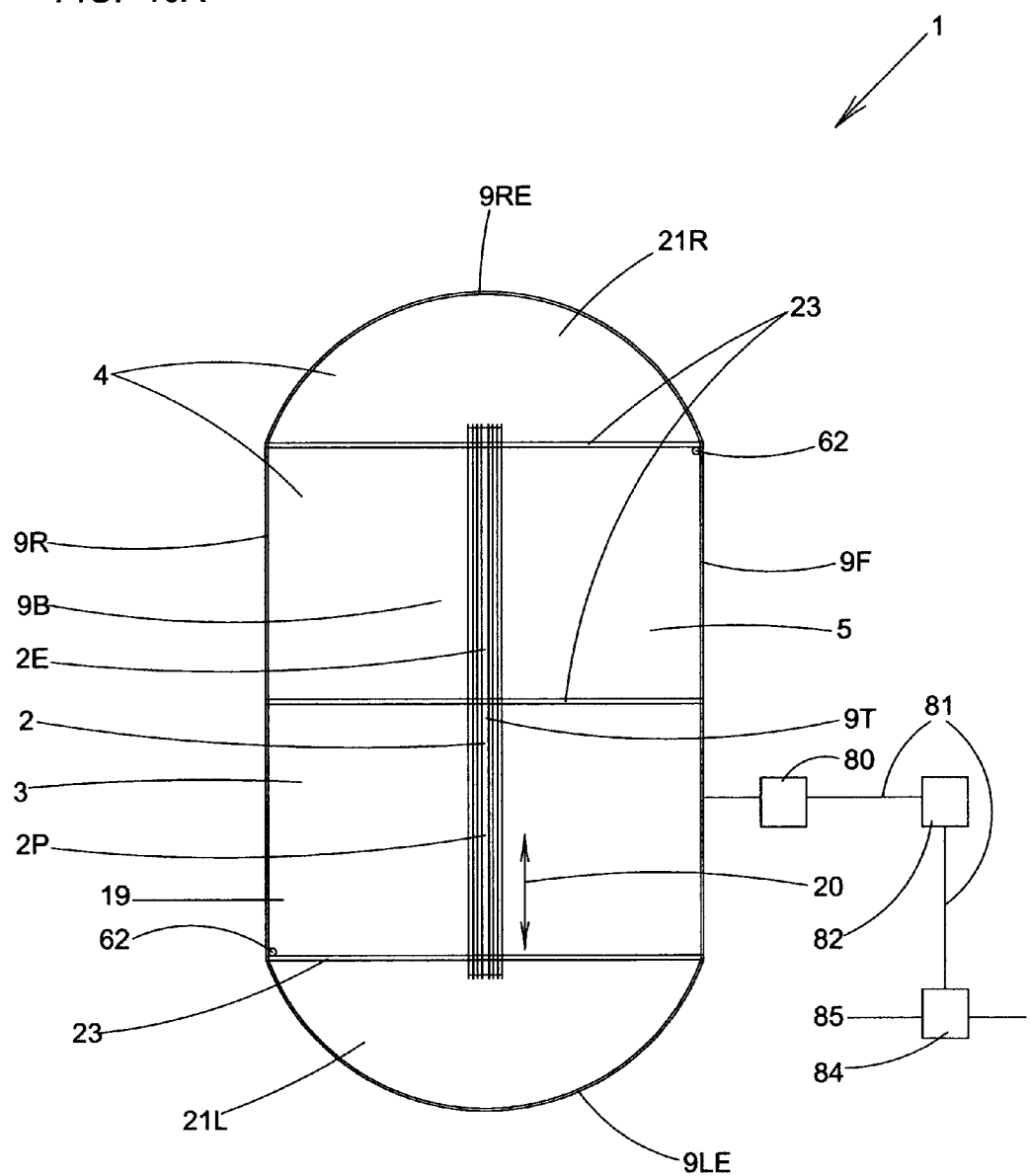
FIG. 10A shows a top view of an embodiment wherein power output from the solar power collector is further acted upon by at least one of electrical power conditioning means, wire transmission means, storage means, and grid-engagement means.

FIG. 10A shows a top view of an embodiment similar to that shown in FIG. 4A. This embodiment further illustrates an inflatable heliostatic solar power collector 1, wherein the heliostatic control means for aiming said solar power collector, further comprises calibration means including calibration sensor and microprocessor 62, for at least one of (i) adjusting aiming angles of said solar power collector (as for example by commanding incremental angular commands to the elevation control means 11E and the azimuth control means 11E shown in FIG. 1A) and (ii) adjusting shape of the reflection and concentrating surface 3 (as for example by commanding an incremental pressure differential to the means for performing inflation control 50 of FIG. 5B), to optimize reception of sunrays reflected and concentrated by said reflection and concentration surface, on an elongated solar power receiver 2E.

FIG. 10A further illustrates an inflatable heliostatic solar power collector 1, further comprising electrical power conditioning means 80 for conditioning electrical power from the photovoltaic receiver 2P. The electrical power conditioning means 80 may perform one or more of electrical power conditioning functions known from the prior art, such as DC to or from AC conversion, voltage changing, voltage and/or current stabilizing, phase control or changing, and/or other electrical power conditioning functions as are known from the prior art.

FIG. 10A further illustrates an inflatable heliostatic solar power collector 1, wherein power output from the solar power collector 1 is further acted upon by at least one of electrical power conditioning means 80 for conditioning electrical power, wire transmission means 81 for transmitting electrical power, storage means 82 for storing energy obtained from a time integration of power from said solar power collector and for retransmitting power from said storage means when desired, and grid-engagement means 84 for permitting said power output to feed back into an electrical power grid 85 and at least one of slow, stop and reverse an electrical meter measuring net power flow from or to said electrical power grid 85. The storage means 82 may utilize any of many known prior art technologies for storing energy, including battery, chemical, flywheel, and water pump & hydroelectric generator means for storing energy.

Figure 10B:
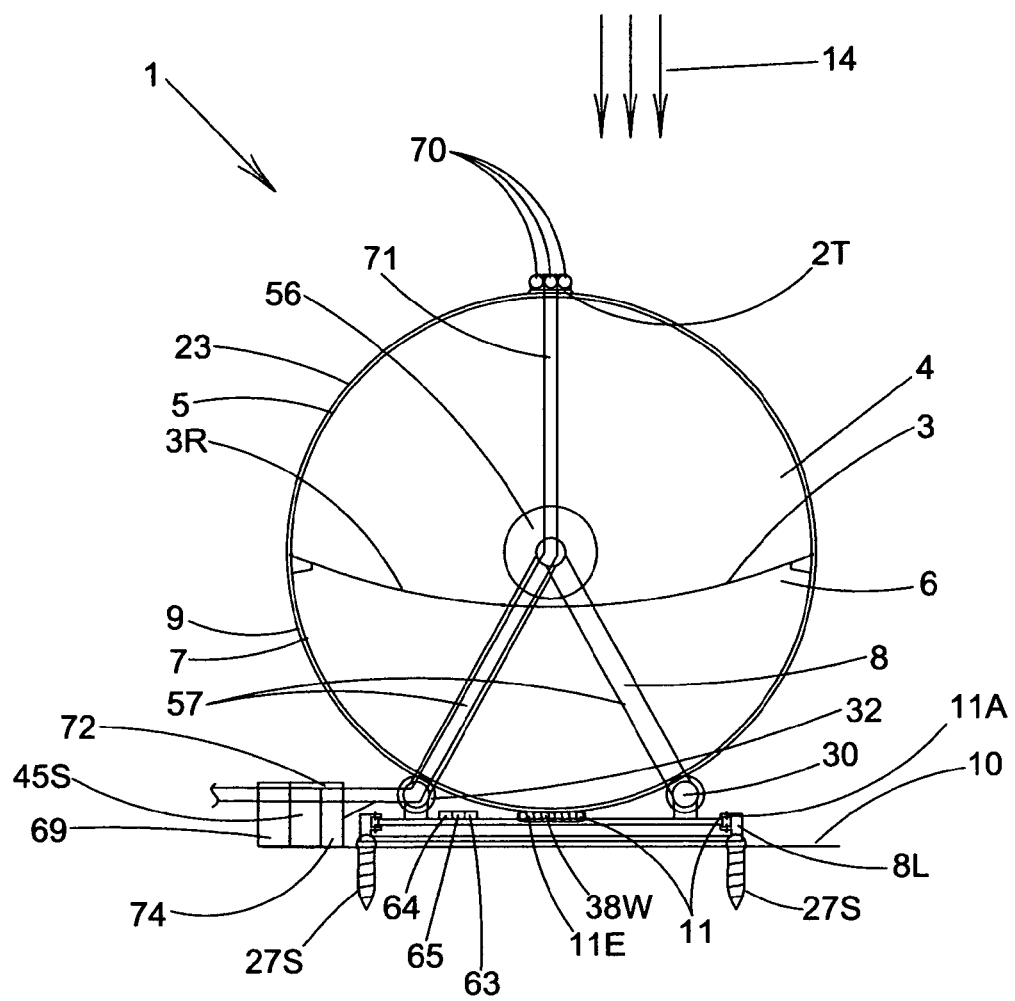
FIG. 10B shows a left side view of an embodiment wherein the heliostatic control means includes a hybrid power generation system and at least one of aiming processor means, stow processor means, and diagnostic processor means.

FIG. 10B shows a left side view of an embodiment similar to that shown in FIG. 6A, illustrating an inflatable heliostatic solar power collector 1, wherein the heliostatic control means 11 includes at least one of aiming processor means 63 for algorithmically computing and commanding desired orientation of said heliostatic solar power collector, stow processor means 64 for computing and commanding protective stow position of said solar power collector, and diagnostic processor means 65 for identifying at least one of nonoptimal and faulty operation of said heliostatic solar power collector. The various processor means may of course be combined into one or more multifunction processors, microprocessors or computers, in variant embodiments of the invention, with appropriate connectivity to sensors, controls, displays or annunciation means, and effectors and/or actuators. The aiming processor means 63 will preferably issue azimuth angle and elevation angle commands to the azimuth control means 11A and the elevation control means 11E respectively. The aiming processor means may also optionally issue concavity commands to control focusing concavity of a reflective membrane 3R. The stow processor means 64 may be connected to a wind sensor, a precipitation sensor, and/or a potentially damaging particulate sensor (e.g., to sense sand in a sandstorm, and/or sleet and/or hail), and when the transparent surface 5 is in danger of being damaged, the stow processor means may command the inflatable heliostatic solar power collector 1 to an orientation which will eliminate or minimize damage to the transparent surface 5, e.g., a downward orientation and/or a downwind orientation. Alternately, the stow processor means may annunciate a dangerous condition to an operator, and request installation of a covering tarp to protect the transparent surface. Alternate embodiments with self-deploying reel-out tarps are also possible. The diagnostic processor means 65 will receive diagnostic signals from appropriate sensors, to enable it to diagnose nonoptimal and/or faulty operation such as nonoptimal/faulty pointing, nonoptimal/faulty reflective surface shaping, and/or optical faults with the transparent surface 5 and/or with the reflection and concentrating surface 3 (as for example caused by dirt, deposits or scratches on these surfaces). If the transparent surface is dirty enough as to degrade performance, the diagnostic processor may annunciate this to an operator, who can then hose off the transparent surface 5 to clean it, or wash with a cleaning solution such as soap solution or a dirt solvent solution. The diagnostic processor may also diagnose pressure leaks or pressure control faults, and/or solar receiver and/or heat system and/or electrical system faults.

FIG. 10B also illustrates the use of a hybrid power generation system, with the steam turbine module 45S driven either by steam from the boiling tubes 70 and transport tubes 71, and/or steam from a fuel-driven steam boiler 74, such as a fossil fuel powered unit, to make this a hybrid powerplant with both renewable solar power and nonrenewable fuel-driven source power, to permit all-weather (e.g., including periods of cloud cover or rain) and night operation of the powerplant.

Figure 10C:
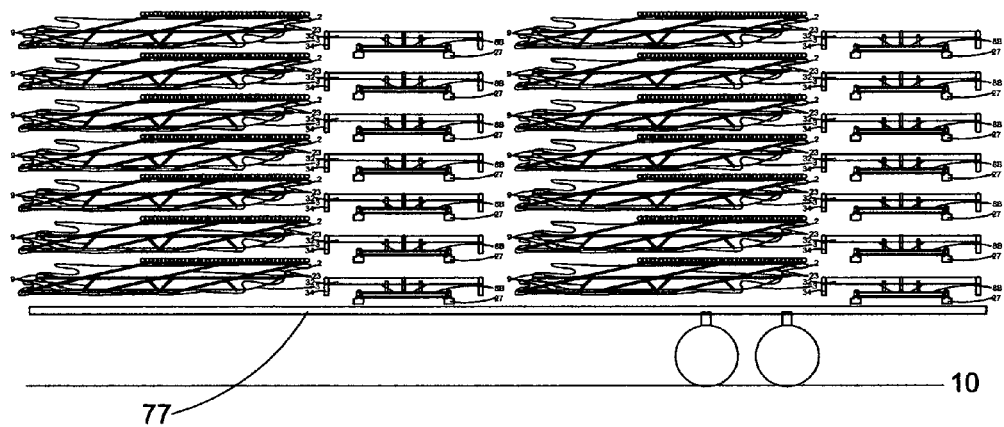
FIG. 10C shows a rear view illustrating space-efficient transport of stacked inflatable heliostatic solar power collectors, in an un-inflated and compact disassembled configuration, on a flatbed trailer.

FIG. 10C shows a rear view of a variant of the embodiment shown in FIG. 3A, with the structural rings 23 hingedly attached to the rest of the framing members 9 so as to enable the inflatable heliostatic solar power collector to be deflated and folded into a shorter height profile, to enable transport of stacks of the upper portions with the structural rings angled as shown, and other stacks of the base part including the structural base ring 8B and the rear support bar 32 as shown, on a flatbed trailer 77. The illustrated embodiment has two stacks each of upper portions and lower portions, seven high, to enable carriage of 14 complete inflatable heliostatic solar power collectors on the flatbed trailer, in this embodiment. Many variations are possible within the spirit and scope of the invention as defined.

Figure 10D:
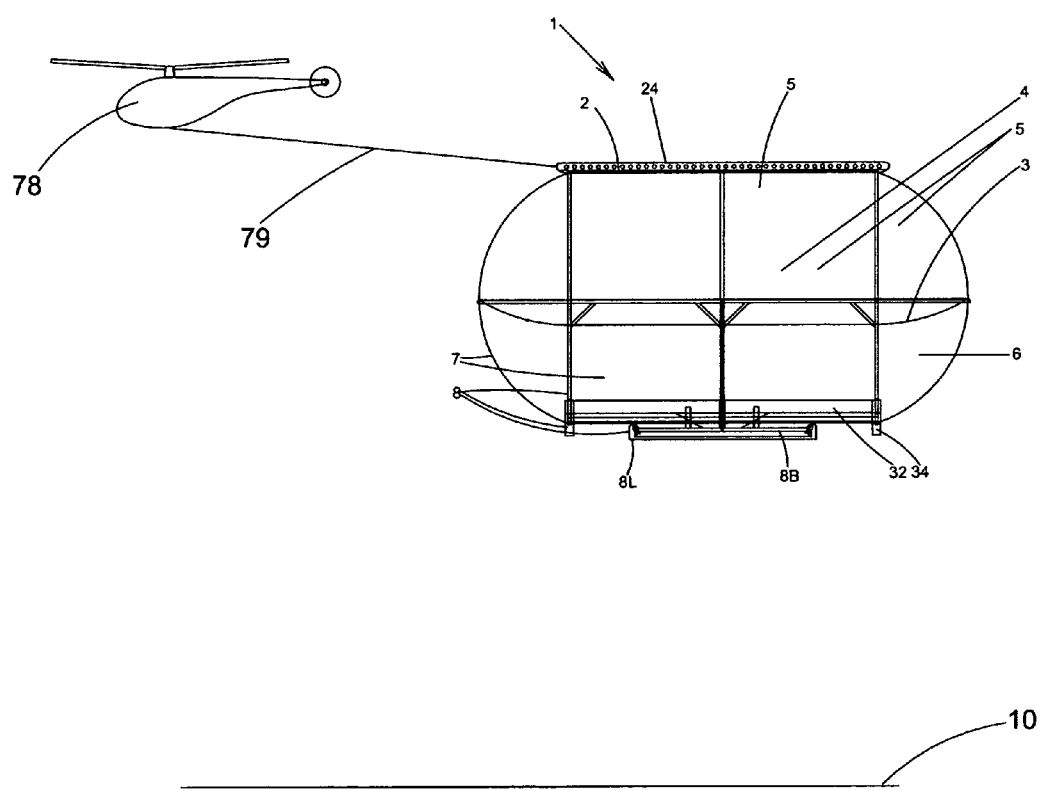
FIG. 10D shows air transport of a very large complete inflatable heliostatic power collector, inflated with lifting gas.

FIG. 10D shows transport of a very large complete inflatable heliostatic power collector 1, inflated with lifting gas (such as helium or hydrogen) in the upper inflatable volume 4 and lower inflatable volume 6, to enable air transport of this very large device from a place of manufacture to a place of siting. A tow aircraft 78 is shown pulling the device via a tow bar or cable 79. The illustrated tow aircraft 78 is a helicopter, but alternate embodiments could use an airship, blimp, or hybrid heavier-than-air airship with supplementary propulsive or aerodynamic lift.

Figure 11:
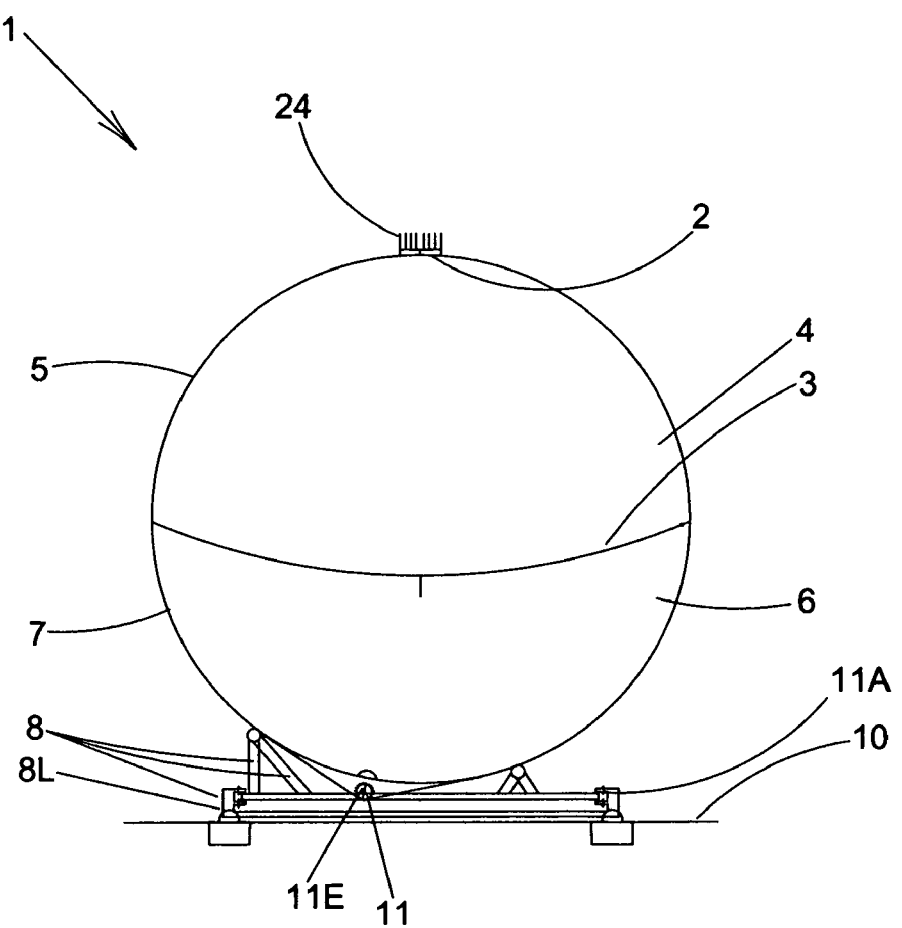
FIGS. 11 and 12 show left end and rear views, respectively, of an alternate embodiment with a different support structure arrangement
Figure 12:
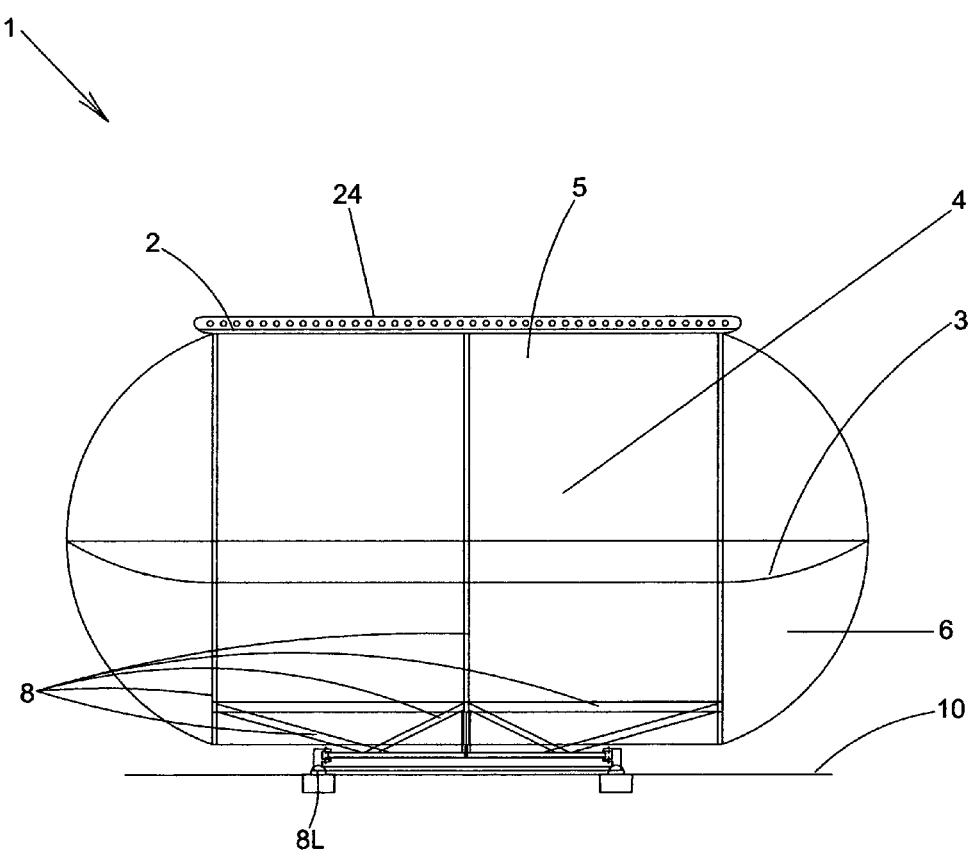

FIGS. 11 and 12 show views corresponding to those of FIGS. 1A and 3A, of an alternate embodiment with a different support structure 8 arrangement, as shown.

While certain preferred embodiments of the invention have been described with reference to the attached Figures, it should be understood that further variations and alternate embodiments of the invention are possible within the spirit and scope of the invention as defined in the attached Claims.

What is claimed is:

1. An inflatable heliostatic solar power collector, comprising:
   an elongated solar power receiver;
   a reflection and concentration surface for reflecting and concentrating sunrays;
   a substantially enclosed elongated upper inflatable volume above said reflection and concentration surface, with a transparent surface above said upper inflatable volume;
   a substantially enclosed elongated lower inflatable volume below said reflection and concentration surface, with a bottom surface below said lower inflatable volume;
   elongated side perimeter structural members that have greater length along an axis of elongation than along any other axis, wherein said elongated side perimeter structural members contribute perimeter restraint to said transparent surface above said upper inflatable volume, and wherein said elongated side perimeter structural members contribute perimeter restraint to said bottom surface below said lower inflatable volume, and wherein said elongated side perimeter structural members further contribute to supporting said reflection and concentration surface along at least portions of the perimeter of said reflection and concentration surface;
   support structure for supporting said solar power collector on a supporting surface;
   and heliostatic control means comprising at least one of powered elevation control means and powered azimuth control means for aiming said solar power collector as a function of at least one of (i) time of day, (ii) time of year, (iii) latitude of the location of installation of said heliostatic solar power collector, (iv) installation orientation of the support structure relative to the supporting surface, and (v) slope of the supporting surface, such that incoming sunrays from a sunward direction will be reflected and concentrated by said reflection and concentration surface, onto said elongated solar power receiver at a concentration ratio of at least 2 suns.

2. The inflatable heliostatic solar power collector of claim 1,
further comprising means for performing inflation control including at least one of means for increasing, means for maintaining, means for decreasing, and means for controllably adjusting inflation pressure, in at least one of said upper inflatable volume and said lower inflatable volume.

3. The inflatable heliostatic solar power collector of claim 2,
wherein said means for performing inflation control includes at least one of an inflation valve, a deflation valve, and an air pump.

4. The inflatable heliostatic solar power collector of claim 1,
wherein an upwardly concave desired shape of said reflection and concentration surface is at least in part maintained by the application of differential inflation pressure between said upper inflatable volume and said lower inflatable volume.

5. The inflatable heliostatic solar power collector of claim 1,
wherein said solar power receiver is a photovoltaic receiver.

6. The inflatable heliostatic solar power collector of claim 5,
further comprising means for cooling said photovoltaic receiver comprising at least one of cooling fins, blown air cooling, liquid cooling, and mixed phase boiling cooling.

7. The inflatable heliostatic solar power collector of claim 5,
further comprising electrical power conditioning means for conditioning electrical power from said photovoltaic receiver.

8. The inflatable heliostatic solar power collector of claim 1,
wherein said solar power receiver is a solar thermal receiver.

9. The inflatable heliostatic solar power collector of claim 8,
further comprising means for conveying thermal power from said solar power collector to a destination for the beneficial use of said thermal power.

10. The inflatable heliostatic solar power collector of claim 8,
further comprising thermodynamic engine means for converting a portion of the output of said solar thermal receiver into motion, and further comprising electrical power generation means for converting a portion of said motion into electrical power.

11. The inflatable heliostatic solar power collector of claim 8,
wherein said solar thermal receiver utilizes solar thermal heat flow to power a thermodynamic cycle engine comprising at least one of a Brayton cycle engine, a Rankine cycle engine, a Sterling cycle engine and an Otto cycle engine.

12. The inflatable heliostatic solar power collector of claim 1,
wherein said solar power receiver is a combined photovoltaic receiver and solar thermal receiver.

13. The inflatable heliostatic solar power collector of claim 12,
wherein said elongated solar power receiver includes an elongated solar thermal receiver portion with elongated photovoltaic receiver portions disposed on either side of said elongated solar thermal receiver portion.

14. The inflatable heliostatic solar power collector of claim 12,
wherein incoming sunrays from a sunward direction will be reflected and concentrated by said reflection and concentration surface, onto said photovoltaic receiver, and wherein waste heat from said photovoltaic receiver is conducted as a heat flow to an adjacent solar thermal receiver on the opposite side of said photovoltaic receiver as the light receiving side of the photovoltaic receiver.

15. The inflatable heliostatic solar power collector of claim 1,
wherein said solar power receiver is a linear solar power collector.

16. The inflatable heliostatic solar power collector of claim 1,
wherein said reflection and concentration surface includes at least one of (i) a reflective membrane which is reflective on its upper side and (ii) a mirror element.

17. The inflatable heliostatic solar power collector of claim 1,
wherein said reflection and concentration surface is contacted by at least one of adjacent shaping means for contributing to a desired shape of said reflection and concentration surface, and damping means for damping undesirable motions of said reflection and concentration surface.

18. The inflatable heliostatic solar power collector of claim 17,
wherein said adjacent shaping means comprises at least one of connected substantially rigid shaping structure and connected shaping tension elements.

19. The inflatable heliostatic solar power collector of claim 1,
wherein said elongated side perimeter structural members are contributing parts of a substantially rigid, cage-like structure.

20. The inflatable heliostatic solar power collector of claim 1,
wherein the geometric configuration of said solar power collector includes a central portion with an approximately constant cross-section on planar cuts perpendicular to an axis of elongation of said elongated solar power receiver, and further includes left and right end closure portions on the left and right sides of said central portion, which left and right closure portions serve to provide left and right side enclosure for said upper inflatable volume and said lower inflatable volume.

21. The inflatable heliostatic solar power collector of claim 1,
wherein said support structure includes means for fixedly engaging the supporting surface and further includes bearing-connected means for supporting the combination of said bottom surface, said reflection and concentration surface, said transparent surface and said solar power receiver, so as to permit motion of said combination as commanded and controlled by said heliostatic control means.

22. The inflatable heliostatic solar power collector of claim 21,
wherein said heliostatic control means comprises at least one of (i) powered elevation control means for orienting said combination in elevation angle, and (ii) powered azimuth control means for orienting said combination in azimuth angle.

23. The inflatable heliostatic solar power collector of claim 22,
wherein said powered elevation control means comprises at least one of (i) a powered sprocket engaging an elevation control transmission element selected from the group consisting of a chain and a cable, and (ii) a powered gear engaging and driving a gear element on a structural ring engaging said transparent surface and said bottom surface and enclosing a region which includes portions of said upper inflatable volume and said lower inflatable volume.

24. The inflatable heliostatic solar power collector of claim 22,
wherein said powered azimuth control means comprises at least one of (i) a powered sprocket which engages an azimuth control transmission element selected from the group consisting of a chain and a cable, and (ii) a powered gear below said bottom surface which powered gear engages and drives a gear element on an azimuth control element selected from the group of a structural base ring portion of said support structure and a base plate portion of said support structure.

25. The inflatable heliostatic solar power collector of claim 1,
wherein said heliostatic control means for aiming said solar power collector, further comprises a sensor.

26. The inflatable heliostatic solar power collector of claim 1,
wherein said heliostatic control means includes at least one of aiming processor means for algorithmically computing and commanding desired orientation of said heliostatic solar power collector, stow processor means for computing and commanding protective stow position of said solar power collector, and diagnostic processor means for identifying at least one of nonoptimal and faulty operation of said heliostatic solar power collector.

27. The inflatable heliostatic solar power collector of claim 1,
wherein said heliostatic control means includes at least one of an electrically powered motor, a linear actuator, and a stepper motor.

28. The inflatable heliostatic solar power collector of claim 1,
wherein said supporting surface is an Earth surface.

29. The inflatable heliostatic solar power collector of claim 1,
wherein said support structure includes at least one of permanently connected elongated framing members forming a framework around the upper inflatable volume and lower inflatable volume, and detachably connected elongated framing members forming a framework around the upper inflatable volume and lower inflatable volume.

30. An inflatable heliostatic solar power collector, comprising:
an inflatable volume with a substantially constant cross-section;
an elongated solar power receiver at the sunward side on top of said cross-section when the Sun is directly overhead;
a reflection and concentration surface traversing said cross-section and dividing said inflatable volume into an upper part and a lower part;
a transparent surface above said upper part;
a bottom surface below said lower part;
elongated side perimeter structural members that have greater length along an axis of elongation than along any other axis, wherein said elongated side perimeter structural members contribute perimeter restraint to said transparent surface above said upper part, and wherein said elongated side perimeter structural members contribute perimeter restraint to said bottom surface below said lower part, and wherein said elongated side perimeter structural members further contribute to supporting said reflection and concentration surface along at least portions of the perimeter of said reflection and concentration surface;
end cap means for closing the two ends of said inflatable volume outward from the end planes bounding the constant cross-section portion of the inflatable heliostatic solar power collector;
and heliostatic control means comprising at least one of powered elevation control means and powered azimuth control means for aiming said solar power collector as a function of at least one of (i) time of day, (ii) time of year, (iii) latitude of the location of installation of said heliostatic solar power collector, (iv) installation orientation of the support structure relative to the supporting surface, and (v) slope of the supporting surface, such that incoming sunrays from a sunward direction will be reflected and concentrated by said reflection and concentration surface, onto said elongated solar power receiver at a concentration ratio of at least 2 suns.

31. The inflatable heliostatic solar power collector of claim 30,
wherein the upper part of said inflatable volume is inflatable.

32. The inflatable heliostatic solar power collector of claim 30,
further comprising a plurality of cross-section perimeter enclosing structural rings which can contribute to restraining said transparent surface and said bottom surface against inflation-induced forces arising from inflation of said inflatable volume.

33. The inflatable heliostatic solar power collector of claim 32,
wherein said heliostatic control means includes elevation control means for engaging and precisely rotating at least one of said structural rings to effect elevation angle control of said solar power collector.

34. An inflatable heliostatic solar power collector, comprising:
a reflection and concentration surface for reflecting and concentrating sunrays;
a substantially enclosed upper inflatable volume above said reflection and concentration surface, with a transparent surface above said upper inflatable volume;
a substantially enclosed lower inflatable volume below said reflection and concentration surface, with a bottom surface below said lower inflated volume;
support structure for supporting said solar power collector on a supporting surface;
and heliostatic control means comprising at least one of powered elevation control means and powered azimuth control means for aiming said solar power collector as a function of at least one of (i) time of day, (ii) time of year, (iii) latitude of the location of installation of said heliostatic solar power collector, (iv) installation orientation of the support structure relative to the supporting surface, and (v) slope of the supporting surface, such that incoming sunrays from a sunward direction will be reflected and concentrated by said reflection and concentration surface, onto a structurally connected solar power receiver, at a concentration ratio of at least 2 suns;

wherein said solar power receiver further comprises means for generating useful electrical power from received solar power;

wherein said solar power receiver is an elongated solar power receiver that has greater length along an axis of elongation than along any other axis;

wherein said reflection and concentration surface has greater length along said axis of elongation than along any other axis;

wherein an upwardly concave desired shape of said reflection and concentration surface is at least in part maintained by the application of differential inflation pressure between said upper inflatable volume and said lower inflatable volume;

further comprising an elongated structural member that has greater length along an axis of elongation than along any other axis, which elongated structural member provides structural support to maintain said elongated solar power receiver in its desired location and orientation to receive sunrays reflected and concentrated by said reflection and concentration surface; and further comprising elongated side perimeter structural members that have greater length along said axis of elongation than along any other axis, which elongated side perimeter structural members contribute to supporting said reflection and concentration surface along at least portions of the perimeter of said reflection and concentration surface, and which elongated side perimeter structural members also provide perimeter restraint to at least one of said transparent surface and said bottom surface.

35. The inflatable heliostatic solar power collector of claim 34, wherein power output from said solar power collector is further acted upon by at least one of electrical power conditioning means for conditioning electrical power, wire transmission means for transmitting electrical power, storage means for storing energy obtained from a time integration of power from said solar power collector and for retransmitting power from said storage means when desired, and grid-engagement means for permitting said power output to feed back into an electrical power grid and at least one of slow, stop and reverse an electrical meter measuring net power flow from or to said electrical power grid.

36. The inflatable heliostatic solar power collector of claim 34, wherein said transparent surface, said bottom surface, and said reflection and concentration surface each include flexible membrane elements whose shapes are dependent on inflation of said upper inflatable volume and said lower inflatable volume;

further comprising an enclosing structural ring on a plane substantially perpendicular to said axis of elongation, which enclosing structural ring can contribute to restraining said transparent surface and said bottom surface against inflation-induced forces arising from inflation of the upper part and the lower part of said inflatable volume;

and wherein said heliostatic control means includes at least one of (i) electrically powered elevation control means for orienting the inflatable heliostatic solar power collector in elevation angle, and (ii) electrically powered azimuth control means for orienting the inflatable heliostatic solar power collector in azimuth angle.

* * * * *